United States Patent
Kim et al.

(10) Patent No.: US 7,816,228 B2
(45) Date of Patent: Oct. 19, 2010

(54) METHOD OF MANUFACTURING A SEMICONDUCTOR DEVICE

(75) Inventors: Sung-Hwan Kim, Gyeonggi-do (KR); Chang-Woo Oh, Gyeonggi-do (KR); Yong-Lack Choi, Seoul (KR); Na-Young Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 558 days.

(21) Appl. No.: 11/772,341

(22) Filed: Jul. 2, 2007

(65) Prior Publication Data
US 2008/0124893 A1    May 29, 2008

(30) Foreign Application Priority Data
Jul. 3, 2006  (KR) ...................... 10-2006-0061793

(51) Int. Cl.
*H01L 21/76* (2006.01)
(52) U.S. Cl. ...................... 438/426; 438/294; 438/296; 438/424; 438/589; 257/E21.546; 257/E21.553
(58) Field of Classification Search ................ 438/294, 438/296, 297, 426; 257/E21.546, E21.553
See application file for complete search history.

(56) References Cited

U.S. PATENT DOCUMENTS

| | | | | |
|---|---|---|---|---|
| 2004/0063286 | A1* | 4/2004 | Kim et al. | 438/283 |
| 2005/0093021 | A1 | 5/2005 | Ouyang et al. | |
| 2005/0118783 | A1* | 6/2005 | Oh et al. | 438/421 |
| 2006/0105529 | A1* | 5/2006 | Lee | 438/283 |

FOREIGN PATENT DOCUMENTS

| | | |
|---|---|---|
| JP | 2004247463 | 9/2004 |
| KR | 1020060013122 | 2/2006 |

* cited by examiner

*Primary Examiner*—Charles D Garber
*Assistant Examiner*—Angel Roman
(74) *Attorney, Agent, or Firm*—Volentine & Whitt, PLLC

(57) ABSTRACT

In a method of manufacturing a semiconductor device including a planar type transistor and a fin type transistor, a substrate having a first region and a second region is partially to form an isolation trench defining an isolation region and an active region. An insulation layer liner is formed on sidewalls of the isolation trench in the first region and the second region. An isolation layer fills an inner portion of the isolation trench. The insulation layer liner is partially removed to expose an upper surface of the substrate in the gate region of the first region, and an upper surface and sidewalls of the substrate in the gate region of the second region. A gate oxide layer and a gate electrode are formed on the exposed substrate.

18 Claims, 28 Drawing Sheets

METHOD OF MANUFACTURING A SEMICONDUCTOR DEVICE

CROSS-REFERENCE TO RELATED APPLICATIONS

This application claims priority under 35 USC §119 to Korean Patent Application No. 2006-61793 filed on Jul. 3, 2006, the subject matter of which is hereby incorporated by reference.

BACKGROUND OF THE INVENTION

1. Field of the Invention

The present invention relates to a method of manufacturing a semiconductor device including a transistor. More particularly, the invention relates to a method of manufacture capable of simultaneously forming a planar transistor and fin transistor using a simple process.

2. Description of Related Art

The transistor is the basic building block of contemporary semiconductor memory devices. Since transistors within a particular semiconductor device have many different operating requirements and characteristics, they are commonly implemented in different sizes and with very different structures.

For example, planar type transistors which generally have a well controlled threshold voltage are commonly used in respective cell regions of a semiconductor memory device. In contrast, fin type transistors which generally enjoy fast operating speed due to a relatively high operating current per unit area are commonly used in peripheral circuits surrounding a memory region, as well as the memory array region of a semiconductor memory device.

Conventionally, different transistors require separate fabrication sequences (i.e., application of a defined sequence of fabrication processes required to form a particular structure). Given the disparate transistor types used across the great range of circuits forming contemporary semiconductor devices, for example, this requirement for separate fabrication sequences has become increasingly unwieldy.

As semiconductor devices increase in integration density and computational complexity, different substrates or substrate portions are used to fabricate constituent components and elements. For example, a semiconductor memory device may be manufactured using a bulk silicon substrate, or a silicon-on-insulator (SOI) substrate. Generally speaking, SOI substrates have a structure wherein a single crystalline silicon layer is formed on a buried oxide (BOX) layer.

When a plurality of transistors is formed on a SOI substrate, individual transistors are isolated from one another by the buried oxide layer, such that "latch-up" between the adjacent transistors does not occur and overall parasitic capacitance is reduced. Additionally, since the channel region of each transistor is limited by the buried oxide layer, junction capacitance and junction current leakage between source/drain regions are reduced. Thus, the potential for short channel effects is reduced. Further, transistors formed on a SOI substrate generally operate at faster speeds using relatively less applied power, as compared with similar transistors formed on a bulk silicon substrate.

Unfortunately, the manufacturing costs associated with the use of a SOI substrate are markedly higher than costs associated with the use of a bulk silicon substrate, because the complexity of overall fabrication process used to form a semiconductor device on a SOI substrate is significantly greater. It would be highly desirable to form a semiconductor device having substantially the same performance characteristics on a bulk silicon substrate as on a SOI substrate. That is, without resort to the greater expense and complexity associated with a SOI substrate, it would be very desirable to form a transistor having reduced junction leakage current and junction capacitance, as well as a more competitive power operating point using mass production capabilities associated with bulk silicon substrates.

SUMMARY OF THE INVENTION

In one embodiment, the invention provides a method of manufacturing a semiconductor device, comprising; forming an isolation trench separating first and second regions of a substrate, forming an insulation layer liner on sidewalls of the isolation trench in the first region and the second region, the sidewalls of the isolation trench in the first region being disposed adjacent to a gate region, and the sidewalls of the isolation trench in the second region being disposed on side portions of the gate region, partially removing the insulation layer liner to expose an upper surface of the substrate in the gate region of the first region, and upper and sidewall surfaces of the substrate in the gate region of the second region, and forming a gate oxide layer and a gate electrode on the substrate.

In another embodiment, the invention provides a method of manufacturing a semiconductor device, comprising; forming a sacrificial layer and an active layer on a substrate having a first region and a second region, partially etching the sacrificial layer, the active layer and the substrate to form an isolation trench defining an isolation region and an active region, partially filling the isolation trench with a first isolation layer, the first isolation layer in the first region having a step height greater than side portions of the gate region and the first isolation layer in the second region having a step height greater than the gate region, removing the sacrificial layer to form an opening separating the substrate and the active layer, forming an insulating layer liner along the first isolation layer, sidewalls of the isolation trench and the active layer to fill the opening, completely filling the isolation trench with a second isolation layer, partially removing the insulating layer liner to expose an upper surface of the active layer in the gate region of the first region and the upper and sidewall surfaces of the active layer in the gate region of the second region, and forming a gate oxide layer and a gate electrode on the exposed active layer.

In another embodiment, the invention provides a method of manufacturing a semiconductor device, comprising; forming a sacrificial layer and an active layer on a substrate having a first region and a second region, etching the sacrificial layer, the active layer and the substrate to form an isolation trench defining an isolation region and an active region, partially filling the isolation trench with a first isolation layer, the first isolation layer in the first region having a step height greater than side portions of the gate region and the first isolation layer in the second region having a step height greater than the gate region, removing the sacrificial layer to form an opening separating the substrate and the active layer, forming an insulation layer liner along the first isolation layer, sidewalls of the isolation trench and the active layer to fill the opening, completely filling the isolation trench with a second isolation layer, partially removing the insulating layer liner to expose only an upper surface of the active layer in the gate region of the first and second regions, the insulating layer liner still remaining on sidewalls of the active layer, partially etching the first and second isolation layers to expose the sidewalls of the active layer in the first region and the insulation layer liner remaining on the sidewalls of the active layer in the second region, and forming a gate oxide layer and a gate electrode on the exposed active layer.

In another embodiment, the invention provides a method of manufacturing a semiconductor device, comprising; forming an isolation trench defining an isolation region and an active region on a substrate, forming an insulation layer liner on sidewalls of the isolation trench disposed at side portions of a gate region, filling the isolation trench with an isolation layer, partially removing the insulation layer liner to expose upper and sidewall surfaces of the substrate in the gate region, and forming a tunnel oxide layer, a charge trap layer pattern and an electrode on the exposed substrate.

In another embodiment, the invention provides a method of manufacturing a semiconductor device, comprising; forming a sacrificial layer and an active layer on a substrate, partially etching the sacrificial layer, the active layer and the substrate to form an isolation trench defining an isolation region and an active region, partially filling the isolation trench with a first isolation layer, the first isolation layer having a step height greater than a gate region, removing the sacrificial layer to form an opening separating the substrate and the active layer, forming an insulation layer liner along the first isolation layer, sidewalls of the isolation trench and the active layer to fill the opening, completely filling the isolation trench with a second isolation layer, partially removing the isolation layer liner to expose upper and sidewall surfaces of the active layer in the gate region, and forming a tunnel oxide layer, a charge trap layer pattern and an electrode on the exposed active layer.

In another embodiment, the invention provides a method of manufacturing a semiconductor device, comprising; forming a sacrificial layer and an active layer on a substrate having a first region and a second region, partially etching the sacrificial layer, the active layer and the substrate to form an isolation trench defining an isolation region and an active region, partially filling the isolation trench with a first isolation layer, the first isolation layer in the first region having a step height greater than side portions of a gate region, the first isolation layer in the second region having a step height greater than the gate region, removing the sacrificial layer to form an opening separating the substrate and the active layer, forming an insulation layer liner along the first isolation layer, sidewalls of the isolation trench and the active layer to fill the opening, completely filling the isolation trench with a second isolation layer, partially removing the insulation layer liner to expose only the upper surface of the active layer in the gate region of the first and second regions, leaving the insulation layer liner remaining on the sidewall surfaces of the active layer, partially removing the first and second isolation layers to expose the sidewall surfaces of the active layer in the first region and the insulation layer liner left on the sidewall surfaces of the active layer in the second region, and forming a tunnel oxide layer, a charge trap layer pattern and an electrode on the exposed active layer.

BRIEF DESCRIPTION OF THE DRAWINGS

Embodiments of the invention will be described with reference to the accompanying drawings, in which.

DESCRIPTION OF EMBODIMENTS

Figure 1:
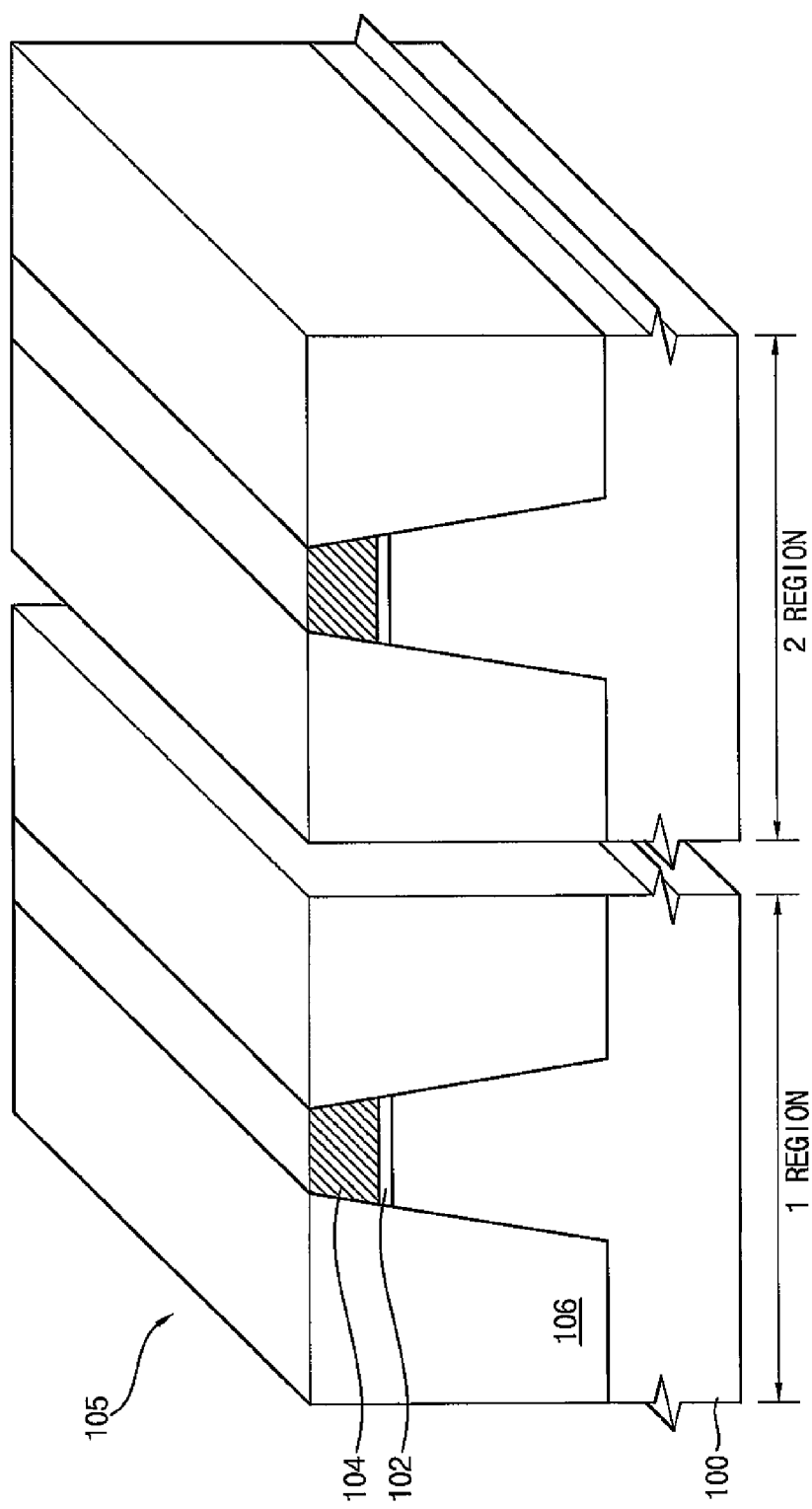
FIGS. 1 to 5 are perspective views illustrating a method of manufacturing a semiconductor device in accordance with an embodiment of the invention.

Embodiments of the invention will be described in some additional detail with reference to the accompanying drawings. The invention may, however, be embodied in many different forms and should not be construed as limited to only the illustrated embodiments. Rather, the embodiments are presented as teaching examples. In the drawings, the relative size of various layers and regions may have been exaggerated for clarity of illustration.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Throughout the written description and drawings, like reference numerals refer to like or similar elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section and other views that are idealized in their schematic illustration. Variations from the illustrated shapes may result, for example, from manufacturing techniques and/or tolerances, and are routinely expected. Thus, example embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, various embodiments of the invention will be explained in some additional detail with reference to the accompanying drawings.

Figure 7:
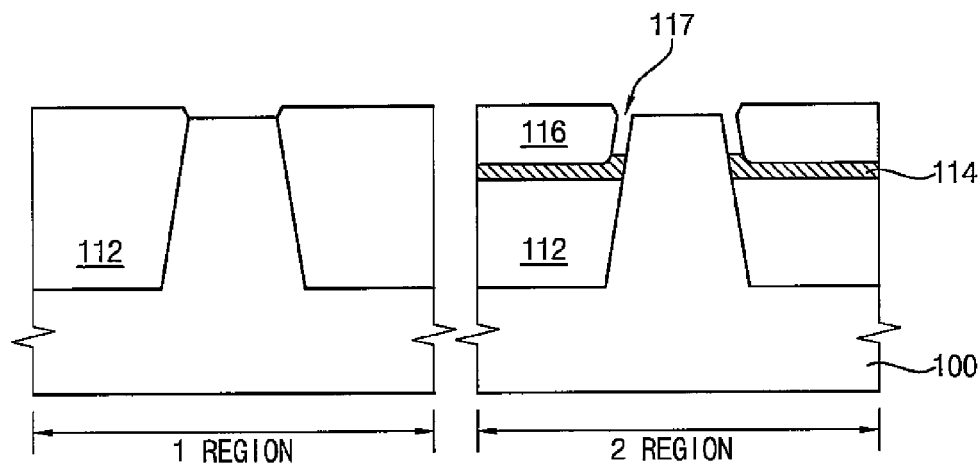
Figure 8:
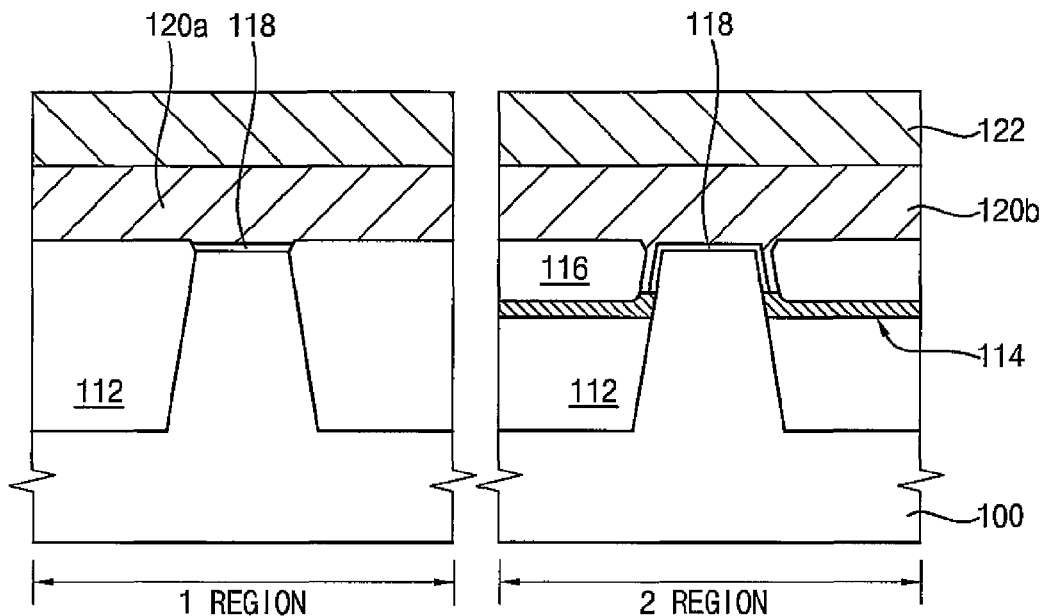

FIGS. 1 to 5 are perspective views illustrating a method of manufacturing a semiconductor device in accordance with an embodiment of the invention. FIGS. 6 to 8 are related cross-sectional views further illustrating the method of manufacture described in relation to FIGS. 1 to 5 as taken along line I-I' shown in FIG. 5.

Referring to FIG. 1, a single crystalline silicon substrate 100 including first and second regions is prepared. A planar type transistor will be formed in the first region, and a fin type transistor will be formed in the second region.

A first pad oxide layer (not illustrated) and a silicon nitride layer (not illustrated) for a hard mask are formed on the silicon substrate 100.

In the illustrated embodiment, the first pad oxide layer may be formed by thermally oxidizing a surface of the substrate 100. The silicon nitride layer for the hard mask may be formed by a chemical vapor deposition (CVD) process. Here, the first pad oxide layer reduces a stress, which is generated between the substrate and the silicon nitride layer, when the silicon nitride layer for the hard mask is formed.

A first photoresist pattern (not shown) is formed on the silicon nitride layer for the hard mask to selectively expose an isolation region. The silicon nitride layer is etched using the first photoresist pattern as an etching mask to form a hard mask pattern 104. Then, the first photoresist pattern may be removed by an ashing process and/or a stripping process.

The pad oxide layer is etched using the first hard mask pattern 104 as an etching mask to form a pad oxide layer pattern 102. Then, the silicon substrate 100 is etched to form an isolation trench 105 for defining isolation regions and respective active regions. That is, a portion of the silicon substrate where the isolation trench 105 is formed becomes the element isolation region, and the residual portion of the substrate becomes an active region (e.g., first and second active regions).

The isolation trench 105 is then filled with an insulation material to form a preliminary isolation layer 106.

In the illustrated embodiment, an insulation layer is formed on the first hard mask pattern 104 to fill the isolation trench 105. For example, the insulation layer may be an undoped silicated glass (USG) oxide layer, a high density plasma (HDP) oxide layer, a tetra-ethyl-ortho-silicate (TEOS) layer formed by plasma-enhanced chemical vapor deposition (PECVD) process, etc. These may be used alone or in a stacked combination. Preferably, the HDP oxide layer having a dense structure and an excellent gap-filling property may be used as the insulation layer. The insulation layer is planarized until an upper surface of the first hard mask pattern 104 is exposed to form the preliminary isolation layer 106.

The preliminary isolation layer 106 may be used to define a first active region and a second active region, respectively. In the illustrated embodiment, the first and second regions have an isolated shape extending in a first direction.

Figure 2:
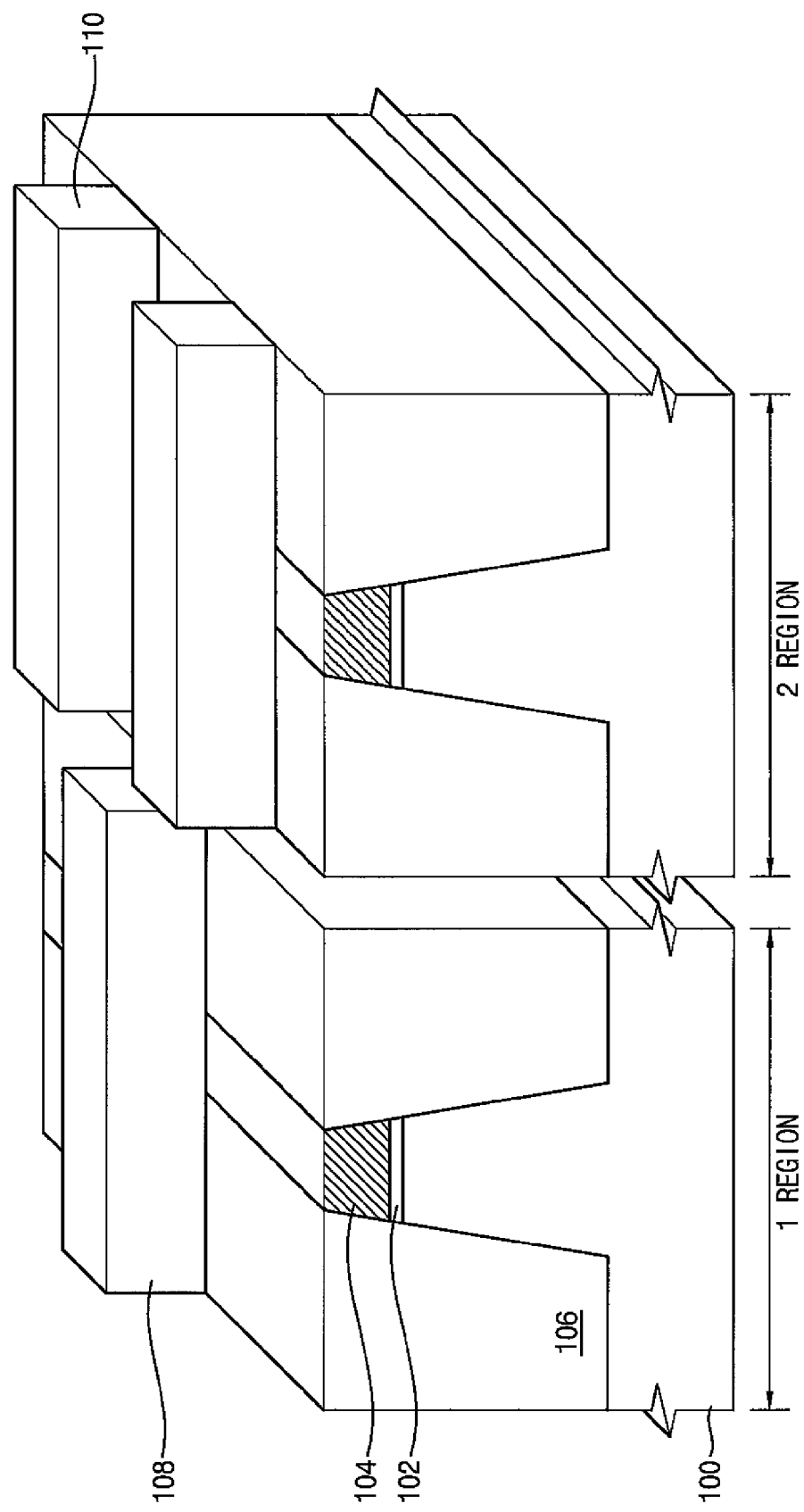

Referring to FIG. 2, after a photoresist film is formed on the first hard mask pattern 104 and the preliminary isolation layer 106, the photoresist film is exposed and developed to form a second photoresist pattern 108 and a third photoresist pattern 110 across the first second active region and the second active region.

Particularly, the second photoresist pattern 108 crossing the first active region has a single linear shape that completely masks a region (hereinafter, referred to as "a gate region") wherein a gate electrode including a planar type transistor will be formed. Although not illustrated, the second photoresist pattern 108 having a linear shape across source/drain regions of the planar type transistor may be additionally formed.

Additionally, the third photoresist pattern 110 crossing the second active region includes two separate linear shapes. The third photoresist pattern 110 does not mask a gate region, but instead masks regions adjacent to the gate region. Although not illustrated in FIG. 2, the third photoresist pattern 110 is used to define a fin type transistor that will sequentially be formed.

In the foregoing embodiment, the second photoresist pattern and the third photo-resist pattern serve as patterns for masking (at least partially) the first and second active regions. Alternatively, the masking pattern may be implemented using a hard mask material.

Figure 3:
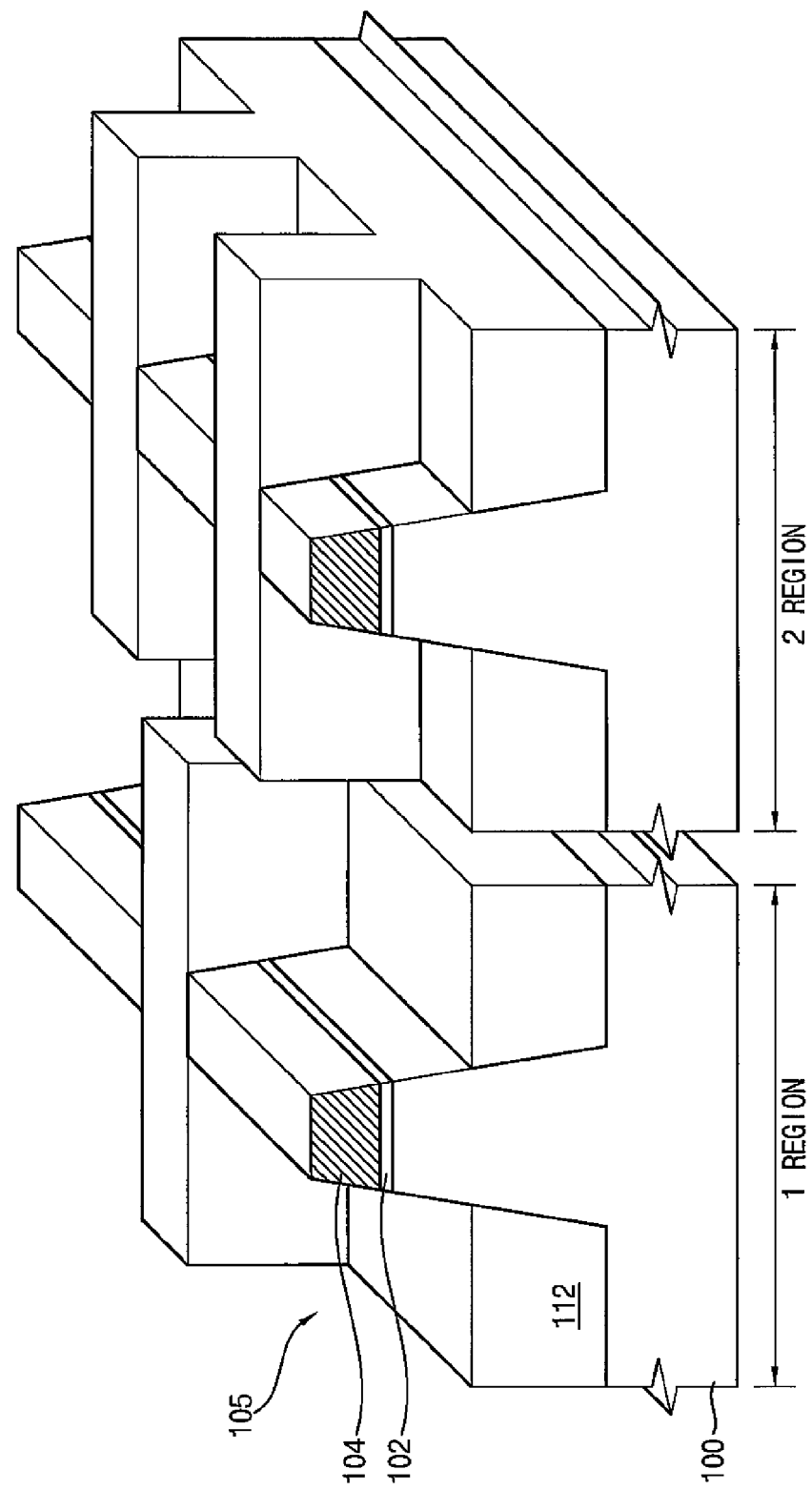

Referring to FIG. 3, an upper portion of the preliminary isolation layer 106 is etched using the second and the third photoresist patterns as etching masks to form a first isolation layer 112. Here, the preliminary isolation layer 106 may be etched to form the first preliminary isolation layer 112 until upper sidewalls, i.e., portions of the sidewalls of the substrate on the first and second active regions of the isolation trench 105 are exposed.

The first isolation layer 112 formed by the etching process has a defined step height. Particularly, the first isolation layer 112 in the first region has the step height greater than that of the both sides of the gate region. In contrast, the first isolation layer 112 in the second region has the step height greater than that of the gate region.

Then, the second and the third photoresist patterns 108 and 110 are removed by an ashing process and/or a stripping process.

Figure 4:
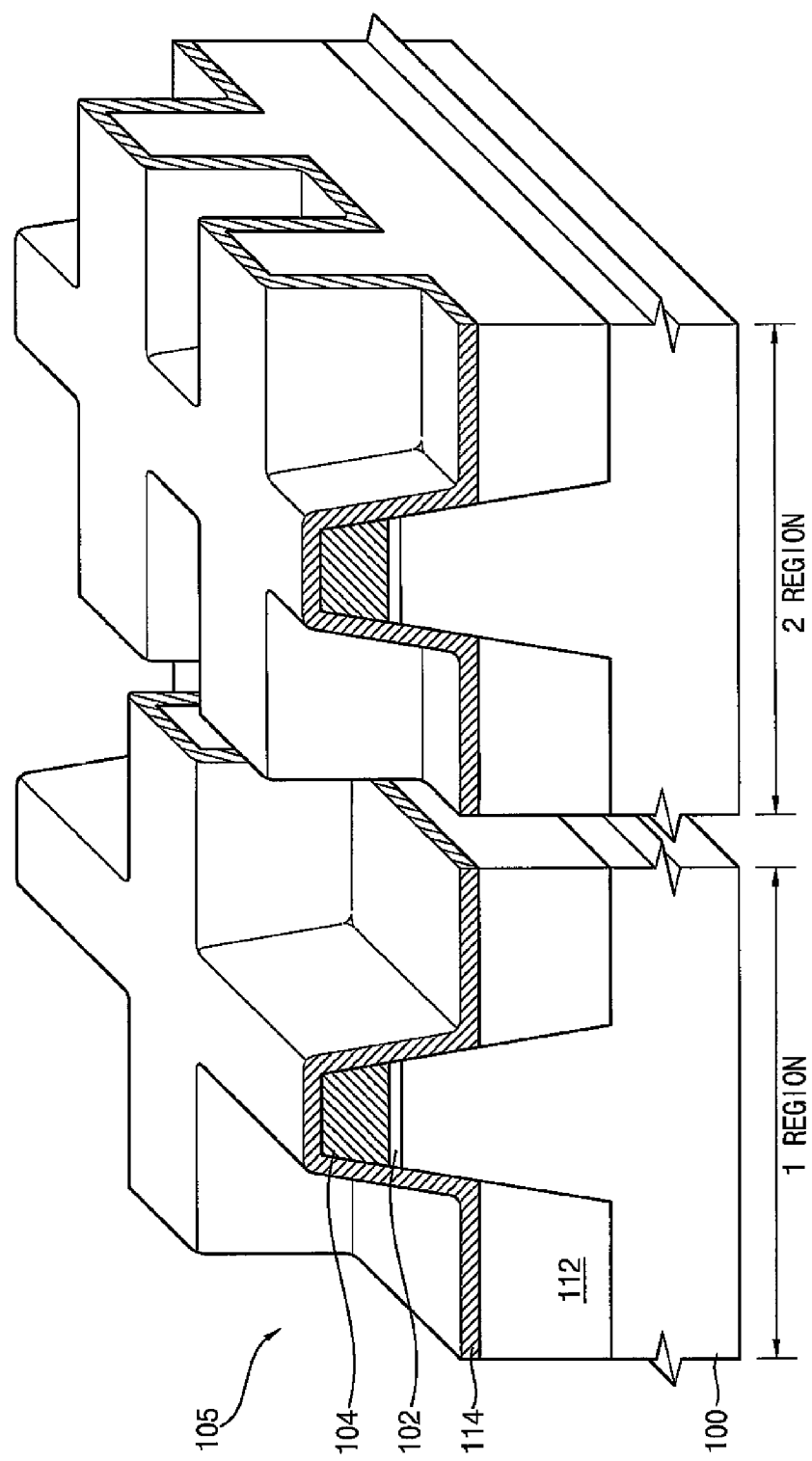

Referring to FIG. 4, a second pad oxide layer (not illustrated) is formed on a surface of the substrate 100 in the first and second active regions.

In the illustrated embodiment, the second pad oxide layer may be formed by thermally oxidizing the surface of the substrate 100. Alternatively, the second pad oxide layer may be formed by depositing silicon oxide by a chemical vapor deposition (CVD) process.

The second pad oxide layer may be used to reduce stress between the substrate and a silicon nitride layer liner 114. Such stress may be generated when the silicon nitride layer liner 114 is subsequently formed. However, the process for forming the second pad oxide layer may be omitted to simplify the overall fabrication process.

However, silicon nitride may be deposited on the exposed sidewall surfaces of the isolation trench 105, the first isolation layer 112 and the hard mask pattern 104 to form a silicon nitride liner 114.

In performing this process, the silicon nitride liner 114 is not formed on the boundaries of the first active region where the gate electrode and planar type transistor will be formed. On the other hand, the silicon nitride liner 114 is formed on boundaries of the second active region where the gate electrode and fin type transistor will be formed.

FIGS. 6 to 8 are related cross-sectional views taken along central portions of the gate electrode forming regions of the first and second regions.

Figure 5:
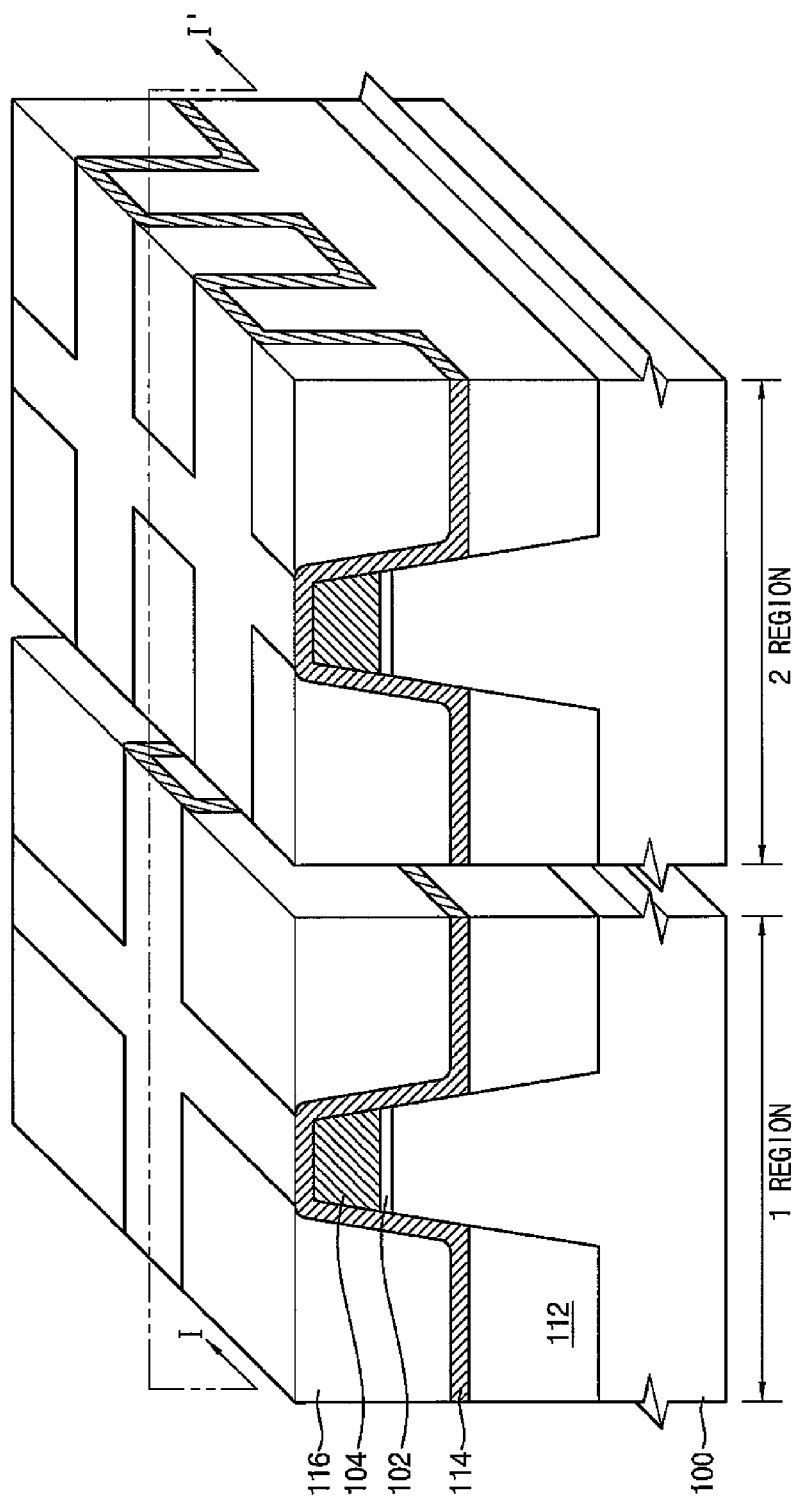
Figure 6:
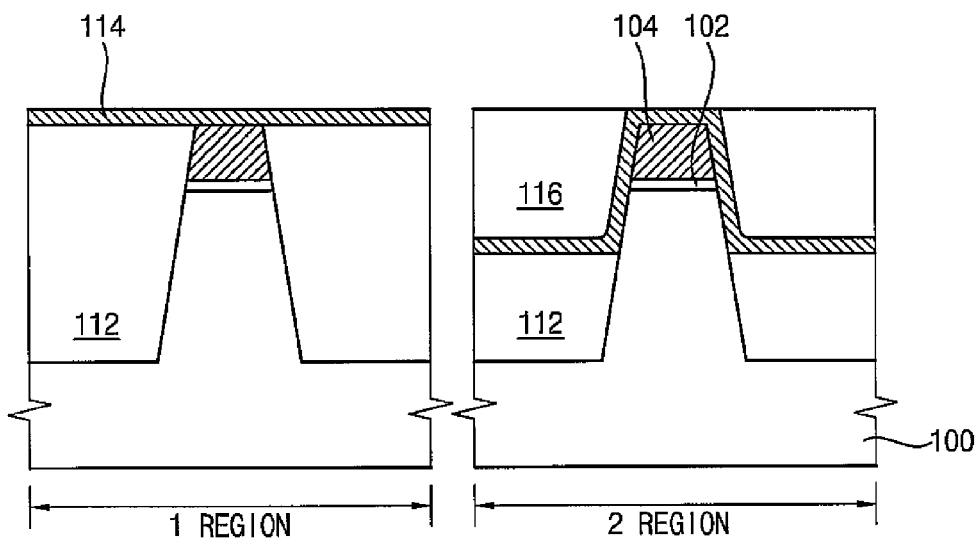
FIGS. 6 to 8 are cross-sectional views further illustrating the method of manufacture described in relation to FIGS. 1 to 5.

Referring to FIGS. 5 and 6, an insulating insulation layer (not shown) is formed on the first hard mask pattern 104 and the first isolation layer 112. Then, the insulating insulation layer is planarized using the first hard mask pattern 104 as an etch stop to form a second isolation layer 116.

Referring to FIG. 7, after the first hard mask pattern 104 is then completely removed, and an upper portion of the silicon nitride liner 114 in the second region is removed. Then, the pad oxide layer pattern 102 is removed to expose an upper surface of the silicon substrate 100. While the pad oxide layer pattern 102 is removed, upper surfaces of the first and second exposed isolation layers are partially removed.

The first hard mask pattern 104 and the silicon nitride liner 114 may be removed simultaneously by the same etching process. The etching process may include a wet etching process using a diluted hydrofluoric acid (HF) solution.

The upper portion of the silicon nitride liner 114 is etched to form an indentation 117 associated with the first active region and first isolation region 112, and with the second active region, silicon nitride liner 114 and second insulting layer 116. Here, sidewall surfaces of the substrate portions forming the first and second active regions may be controllably exposed by the formation of indentation 117 and by controlling the etching process applied to the silicon nitride liner 114. Additionally, the deposited thickness of silicon nitride liner 114 also controls the geometry (e.g., the width) of indentation 117. Here, since the silicon nitride layer is deposited on the second active region corresponding to the gate region, its removal will expose both upper and sidewall surfaces of the substrate 100. In contrast, because the silicon nitride liner 114 is not similarly formed on the first active region corresponding to the gate region, its removal will expose only the upper surface of the substrate.

Referring to FIG. 8, a gate oxide layer 118 is formed on the exposed upper surface portions of the substrate 100. In the illustrated embodiment, the gate oxide layer 118 may be formed by oxidizing the exposed upper surface of the substrate 100 in both the first and second active regions. Here, only the upper surface of the substrate 100 is exposed in the first active region, but both the upper and sidewall surfaces of the substrate 100 is exposed in the second active region.

Then, a gate conductive layer (not shown) is formed on the gate oxide layer 118 to fill the indentation 117. The gate conductive layer may be formed using polysilicon doped with impurities by a low pressure chemical vapor deposition (LPCVD) process. Additionally, a metal material may be formed on the gate conductive layer including polysilicon.

A second hard mask pattern 122 is then formed on the gate conductive layer.

Then, the gate conductive layer is patterned using the second hard mask pattern 122 as an etching mask to form a first gate electrode 120a in the first active region and a second gate electrode 120b in the second active region.

The first gate electrode 120a is disposed in the first active region where the second photoresist pattern is formed. Thus, the first gate electrode 120a does not overlap indentation 117. Accordingly, only the first gate electrode 120a formed on the upper surface of the substrate 100 in the first active region substantially serves as a gate for a planar type transistor.

The second gate electrode 120b is disposed in the second active region where the third photoresist pattern is formed. Thus, the second gate electrode 120b overlaps the indentation 117. Accordingly, the second gate electrode 120b, which is formed on the upper and sidewall surfaces of the substrate 100 supporting gate oxide layer 118 in the second active region, substantially serves as a gate for a fin type transistor.

Thereafter, the substrate 100 may be doped with impurities to selectively form source/drain regions in relation to the first gate electrode 120a and the second gate electrode 120b.

FIGS. 9, 10 and 16 to 18 are cross-sectional views illustrating a method of manufacturing a semiconductor device in accordance with another embodiment of the invention. FIGS. 11 to 15 are related perspective views further illustrating the method of manufacture explained in relation to FIGS. 9, 10, and 16-18 taken along line II-II' shown in FIG. 15.

Figure 9:
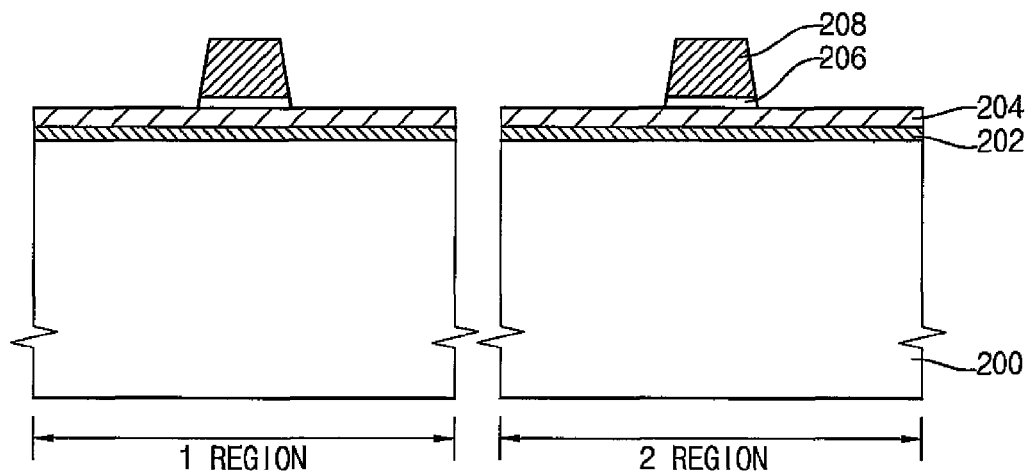
FIGS. 9, 10 and 16 to 18 are cross-sectional views illustrating a method of manufacturing a semiconductor device in accordance with another embodiment of the invention.

Referring to FIG. 9, a single crystalline silicon substrate 200 including first and second regions is prepared. A planar type transistor will be formed in the first region, and a fin type transistor will be formed in the second region.

A sacrificial layer 202 and an active layer 204 are formed on the substrate 200. The sacrificial layer 202 and the active layer 204 may be formed using an epitaxial growth process. In the illustrated embodiment, sacrificial layer 202 is formed from material having the same lattice structure as the active layer 204. That is, there is not a distinct material lattice boundary between active layer 204 and sacrificial layer 202. For example, the sacrificial layer 202 may be formed from silicon germanium, and the active layer 204 may be formed from single crystalline silicon.

A first pad oxide layer 206 and a silicon nitride layer (not illustrated) forming a hard mask are formed on the active layer 204. A surface of the active layer 204 may be thermally oxidized to form the first pad oxide layer 206. The silicon nitride layer for the hard mask may be formed by a chemical vapor deposition (CVD) process. As before, the first pad oxide layer 206 may be used to reduce stress.

A first photoresist pattern (not illustrated) is formed on the silicon nitride layer to selectively expose an isolation region. The silicon nitride layer is then etched using the first photoresist pattern to form a hard mask pattern 208. Then, the first photoresist pattern may be removed by an ashing process and/or a stripping process.

Figure 10:
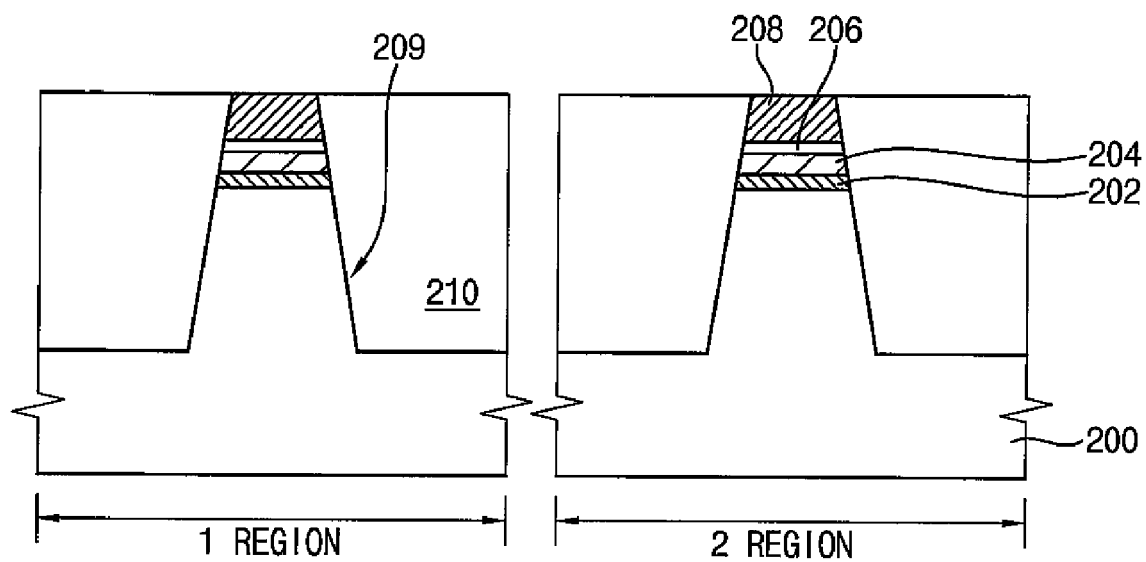

Referring to FIG. 10, first pad oxide layer 206, active layer 204, sacrificial layer 202 and silicon substrate 200 are partially etched using the hard mask pattern 208 as an etching mask to form an isolation trench 209 that will define isolation region from active region.

In the illustrated embodiment, isolation trench 209 may be used to define a first active region in the first region where a planar type transistor will be formed, and a second active region in the second region where a fin type transistor will be formed.

The isolation trench 209 may be filled with an insulation material to form a preliminary isolation layer 210. More particularly, an insulation layer is formed on the first hard mask pattern 208 to fill the isolation trench 209. The insulation layer may be an undoped silicated glass (USG) oxide layer, a high density plasma (HDP) oxide layer, a tetra-ethyl-ortho-silicate (TEOS) layer formed by a plasma-enhanced chemical vapor deposition (PECVD) process, etc. These may be used alone or in a stacked combination thereof. Preferably, a high density plasma (HDP) oxide layer having a dense structure and an excellent gap-filling property may be used as the insulation layer. The insulation layer is then planarized until an upper surface of the first hard mask pattern 208 is exposed to form the preliminary isolation layer 210.

Figure 11:
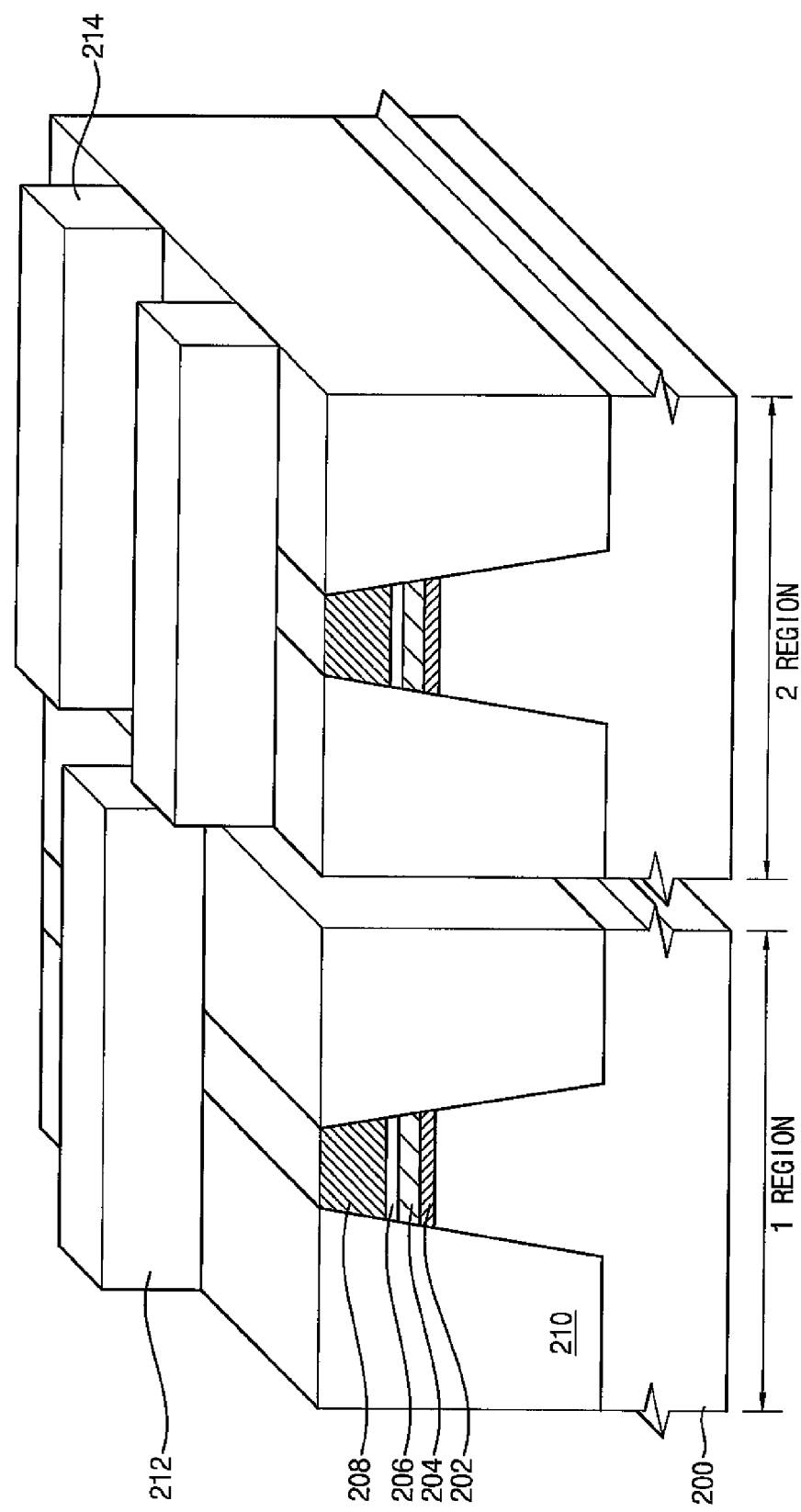
FIGS. 11 to 15 are perspective views further illustrating the method of manufacture described in device in relation to FIGS. 9, 10, and 16 to 18.

Referring to FIG. 11, after a photoresist film is formed on the first hard mask pattern 208 and the preliminary isolation layer 210, the photoresist film is exposed and developed to form second and third photo-resist patterns 212 and 214 across the first and second active regions, respectively.

The second photoresist pattern 212 crossing the first active region has a single linear shape that completely masks a gate region for the planar type transistor. The third photoresist pattern 214 crossing the second active region has two linear shapes. Here, the third photoresist pattern 214 does not mask the gate region, but instead masks portions adjacent to the gate electrode for the fin transistor.

In the illustrated embodiment, the second and the third photoresist patterns 212 and 214 may partially mask the first and second active regions, respectively. Alternatively, a hard mask may be used as the mask pattern.

Figure 12:
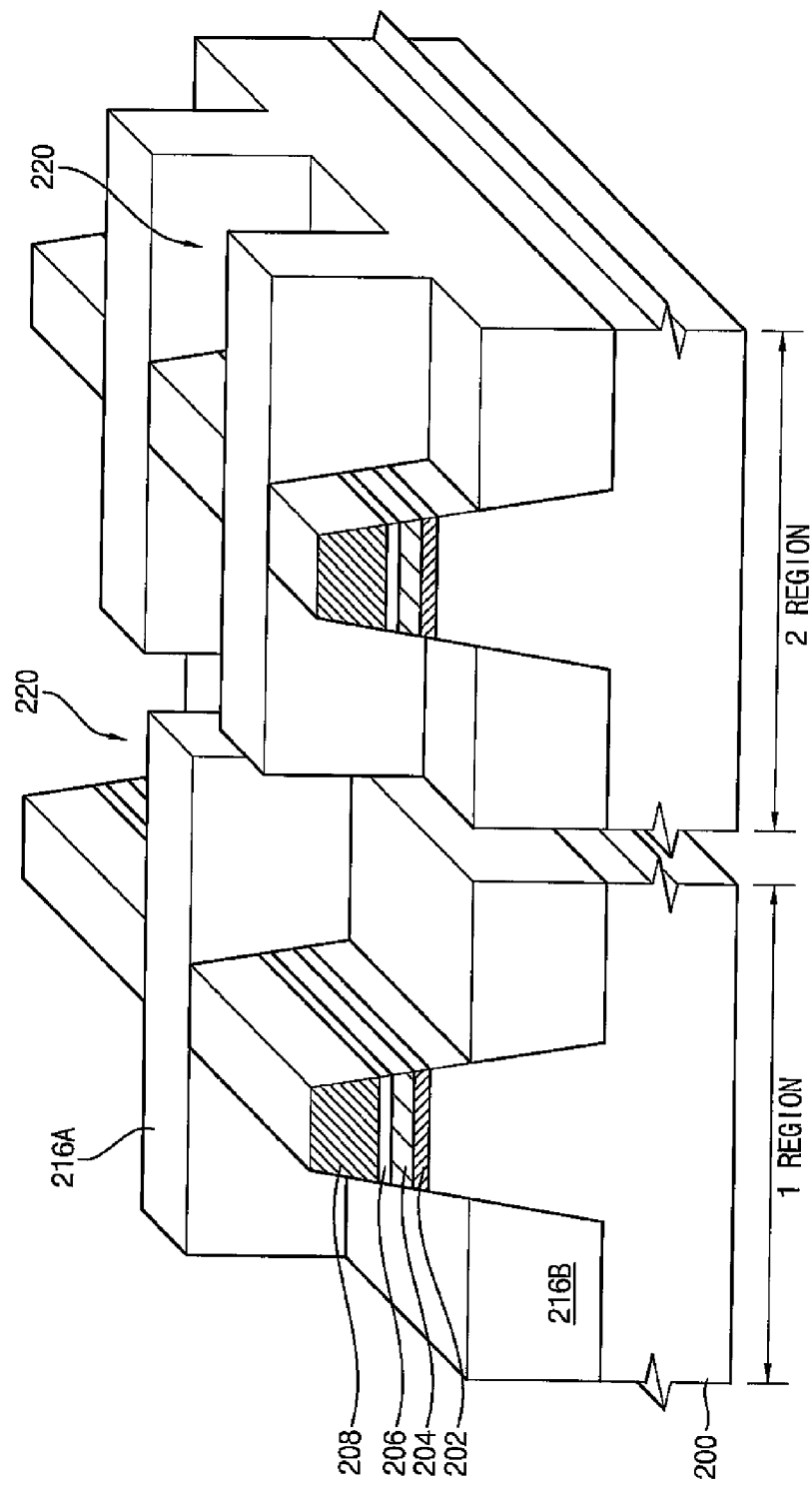

Referring to FIG. 12, an upper portion of the preliminary isolation layer 210 is etched using the second and the third photoresist patterns 212 and 214 as etching masks to form a first isolation layer 216. The first isolation layer 216 formed by the etching process has a high stepped portion 216A and a low stepped portion 216B.

Here, the upper surface of the low stepped portion of first isolation layer 216B is disposed lower than sacrificial layer 202 in the first and second active regions. Thus, sidewall surfaces of active layer 204 and sacrificial layer 202 are exposed by the low stepped portion of first isolation layer 216B.

The second and the third photoresist patterns 212 and 214 may now be removed using conventional ashing and/or stripping process(es).

Figure 13:
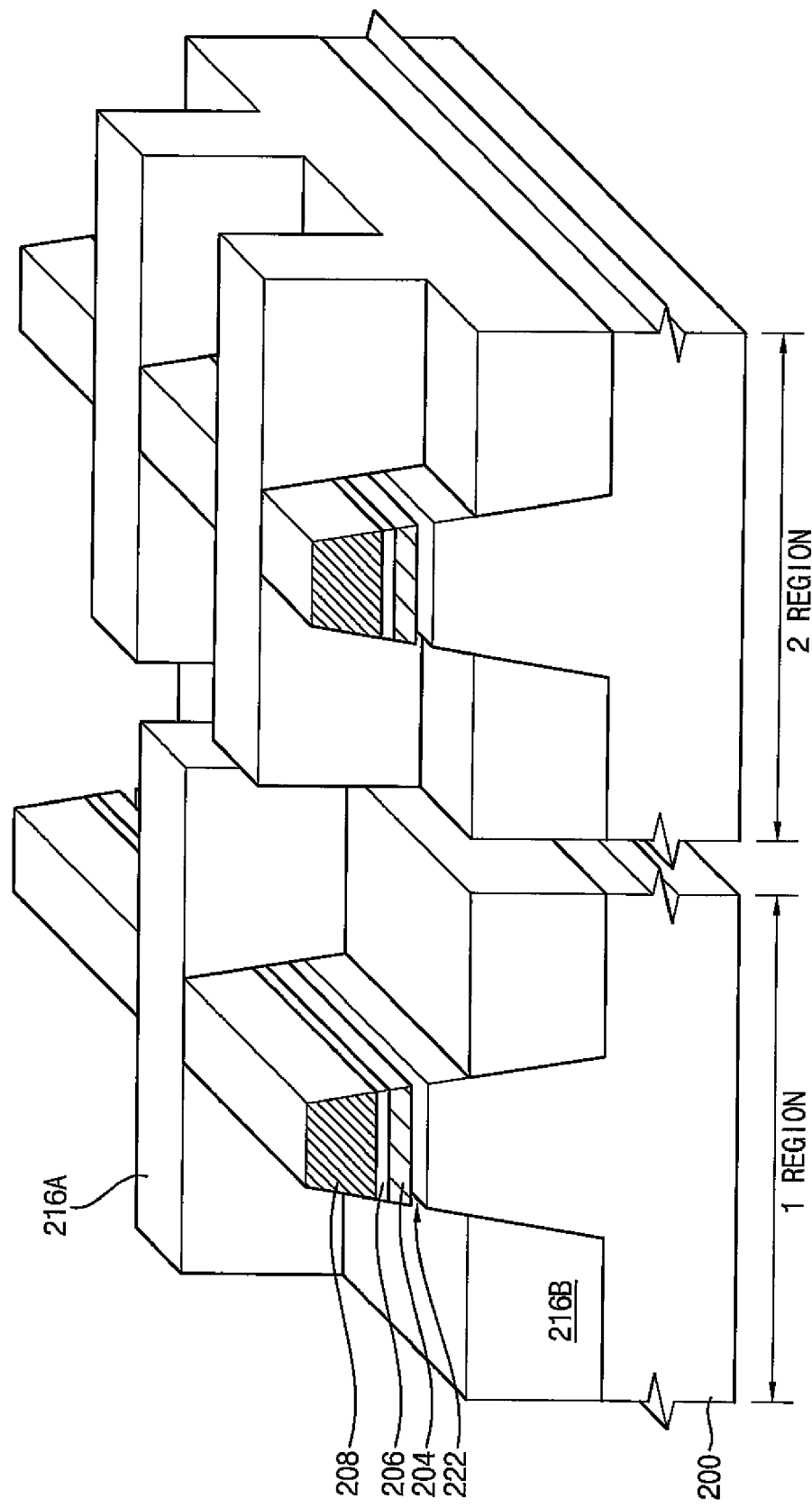

Referring to FIG. 13, the sacrificial layer 202 may be removed using a wet etching process. In the applied wet etching process, an etching solution penetrates into exposed potions of the sacrificial layer 202 to completely remove the sacrificial layer 202.

The removal of sacrificial layer 202 leaves an opening 222 separating the silicon substrate 200 and active layer 204. Here, because the high stepped portion of first isolation layer 216A supports both separated side portions of the silicon substrate 200 and active layer 204, active layer 204 will not collapse.

Here, because the second and the third photoresist patterns 212 and 214 define the geometry of the high stepped portion of the first isolation layer 216A during the previous process, portions of the preliminary isolation layer 210 forming the high stepped portion of the first isolation layer 216A are not etched. In a case where second and the third photoresist pattern 212 and 214 are additionally used to define the geometry of related source/drain regions, the high stepped portion of the first isolation layer 216A may be altered to stably support the active layer 204.

Figure 14:
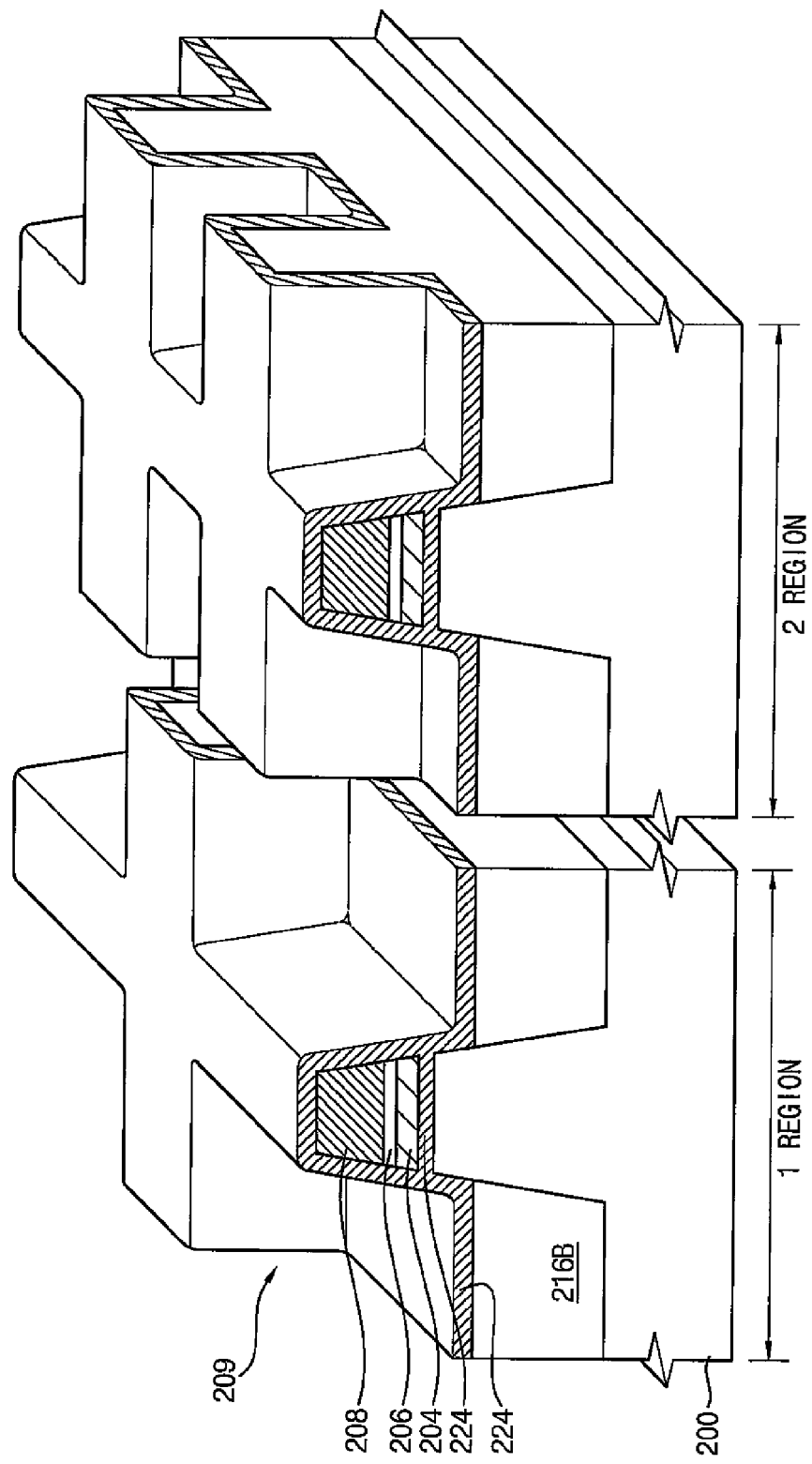

Referring to FIG. 14, a second pad oxide layer (not shown) is formed on the active layer 204 and exposed surfaces of the silicon substrate 200. In one embodiment, the second pad oxide layer will be formed with a thickness defined by the opening 222 resulting from the removal of the sacrificial layer 202.

For example, active layer 204 and silicon substrate 200 may be thermally oxidized to form the second pad oxide layer. Alternatively, silicon oxide may be deposited by a chemical vapor deposition (CVD) process to form the second pad oxide layer.

The second pad oxide layer may be used to reduce stress between active layer 204 and silicon substrate 200 that is generated when a silicon nitride layer liner is formed by a sequential process. However, the process for forming the second pad oxide layer may be omitted in order to simplify the overall fabrication process.

Thereafter, a silicon nitride liner 224 may be formed on sidewall surfaces of the exposed isolation trench 209, the low stepped portion of first isolation layer 216B, first hard mask pattern 208, and opening 222 (or residual portions of opening 222 where a second pad oxide is used). In one embodiment, the silicon nitride liner 224 completely fills opening 222. However, when opening 222 is too wide to be filled by silicon nitride liner 224, its may be completely filled using another insulation material in addition to the silicon nitride liner 224.

Thus, the in-fill of opening 222 forms an effective insulation layer under the active layer 204. Accordingly, the respective first and second active regions act very much like a structure formed on a SOI substrate.

Using the foregoing process, silicon nitride liner 224 is not formed on boundaries of the first active region corresponding to the gate region of the planar type transistor. On the other hand, the silicon nitride liner 224 is formed on boundaries of the second active region corresponding to the gate region of the fin type transistor.

Figure 15:
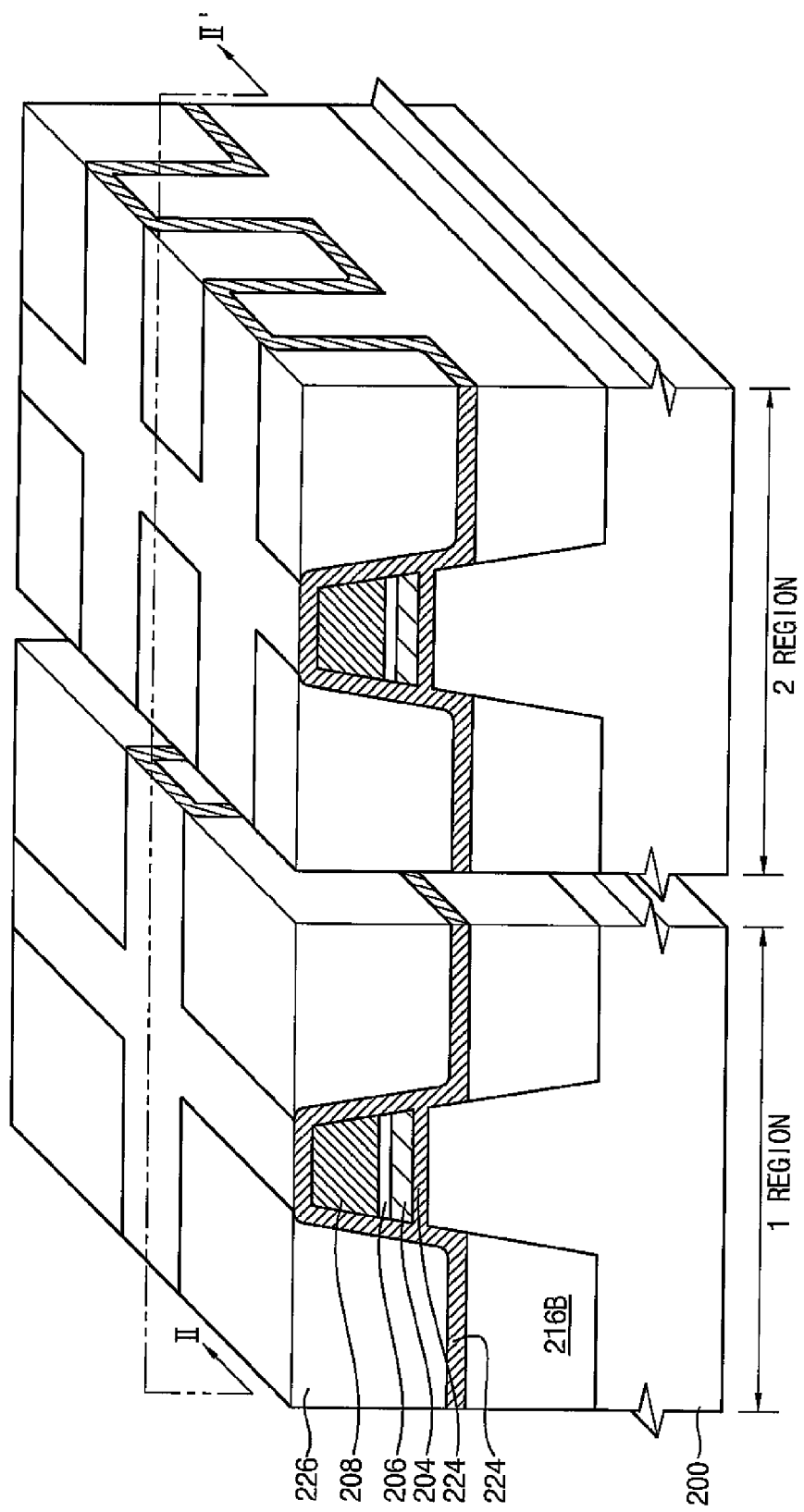
Figure 16:
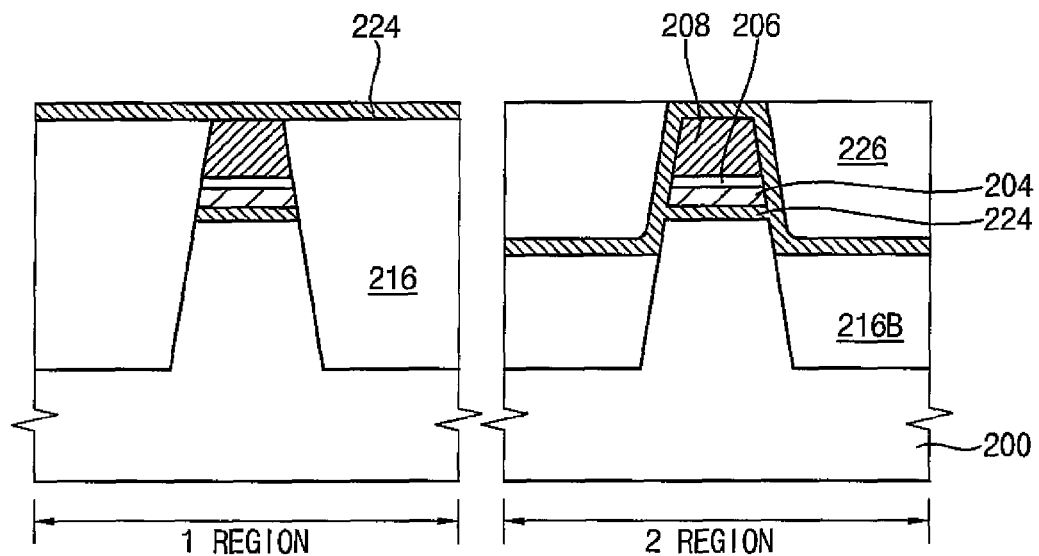

Referring to FIGS. 15 and 16, an isolation insulation layer (not shown) is formed on the first hard mask pattern 208 to fill over the low stepped portion of the first isolation layer 216B. Then, the isolating insulation layer is planarized until a surface of the first hard mask pattern 208 is exposed to form a second isolation layer 226.

Figure 17:
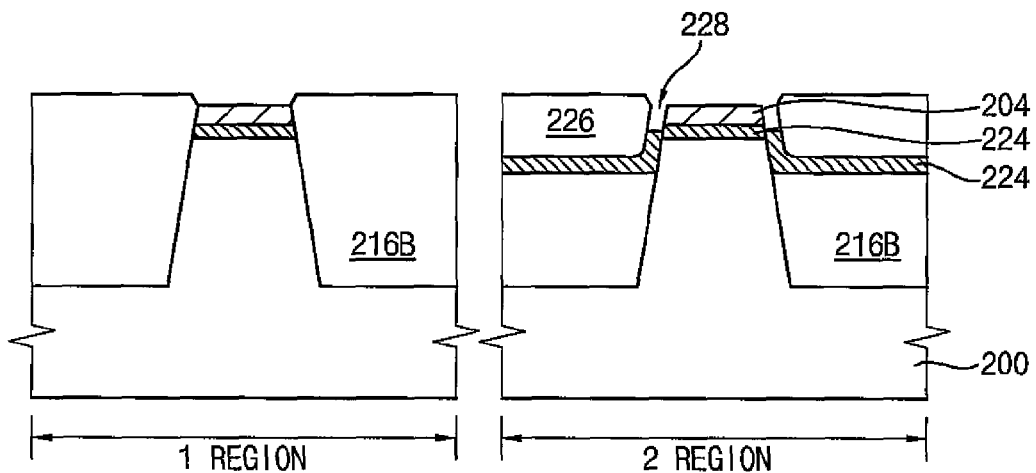

Referring to FIG. 17, the first hard mask pattern 208 and the silicon nitride liner 224 are removed. Preferably the first hard pattern 208 may be completely removed, and the silicon nitride liner 224 may be partially etched in order to sufficiently expose sidewalls of the active layer. Then, the first pad oxide layer is removed to expose an upper surface of the silicon substrate.

The first hard mask pattern 204 and the silicon nitride liner 224 may be removed simultaneously by the same etching process. The etching process may be performed by a wet etching process using a dilute hydrofluoric acid (HF) solution.

Particularly, an upper portion of the silicon nitride liner 224 is etched to form an indentation 228 along the first active region, the second active region and the first isolation layer 216B.

Where the indentation 228 is deeply formed, the silicon nitride layer under the active layer 204 may be removed, and the structure of active layer 204 may become unstable. Therefore, the etching process should be controlled to the extent that the sidewall surfaces of active layer 204 are exposed, but the silicon nitride layer under the active layer 204 is left intact.

Here, the silicon nitride liner 224 disposed on the boundaries of the active layer 204 of the second active region is removed in relation to the gate region. Thus, the upper and sidewall surfaces of the active layer 204 of the second active region corresponding to the gate region are exposed.

On the other hand, because the silicon nitride liner 224 is not formed on the boundaries of the active layer 204 of the first active region corresponding to the gate electrode forming region, only the upper surface of the active layer 204 of the first active region is exposed.

Figure 18:
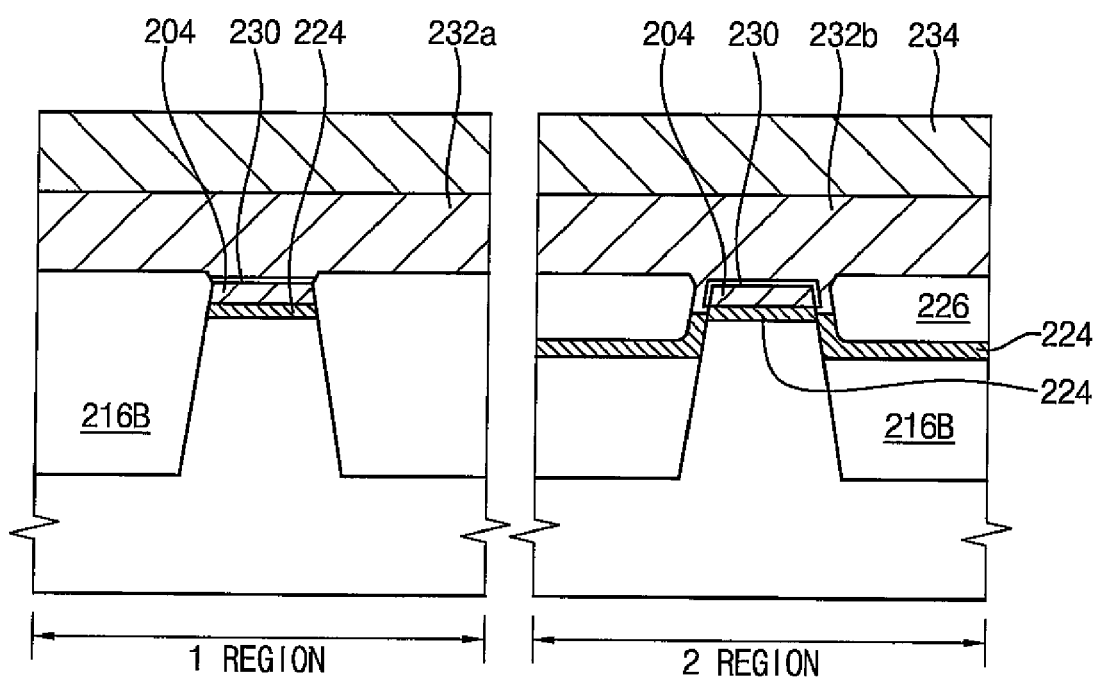

Referring to FIG. 18, a gate oxide layer 230 is formed on the exposed active layer 204. The surface of the exposed active layer 204 may be oxidized to form the gate oxide layer 230.

Then, a gate conductive layer (not shown) is formed on the gate oxide layer 230 to fill the indentation 228. The gate conductive layer may be formed using polysilicon doped with impurities during a low pressure chemical vapor deposition (LPCVD) process. A metal layer may be additionally formed on the gate conductive layer including polysilicon.

A second hard mask pattern 234 is formed on the gate conductive layer.

Thereafter the gate conductive layer is patterned using the second hard mask pattern 234 as an etching mask to form a first gate electrode 232a in the first active region and a second gate electrode 232b in the second active region.

Because the first gate electrode 232a is disposed within the region where the second photoresist pattern is formed, the first gate electrode 232a does not overlap the indentation 228 where the sidewalls of the active layer 204 are partially exposed. Accordingly, the first gate electrode 232a formed on the upper surface of the first active layer 204 substantially serves as the gate of the planar type transistor.

In addition, because the second gate electrode 232b is disposed within the region where the third photoresist pattern is formed, the second gate electrode 232b overlaps the indentation 228 where the sidewalls of the active layer 204 is partially exposed. Accordingly, the second gate electrode 232b formed on the upper and sidewall surfaces of the active layer 204 substantially serves as the gate of the fin type transistor.

Thereafter, impurities may be doped into the substrate 200 using conventional techniques to form related source/drain regions.

Figure 19:
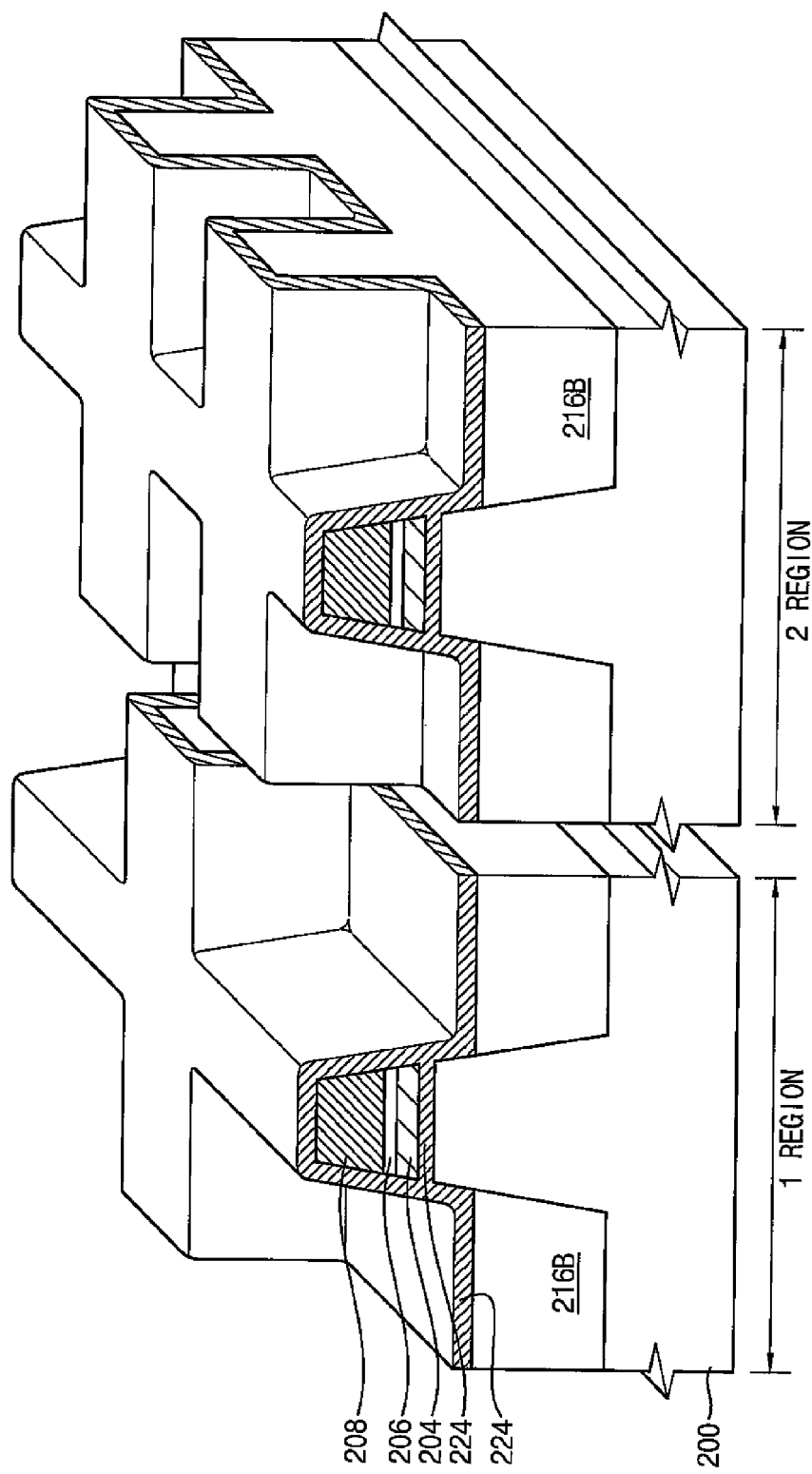
FIGS. 19 to 21 are perspective views illustrating a method of manufacturing a semiconductor device in accordance with another embodiment of the invention.
Figure 20:
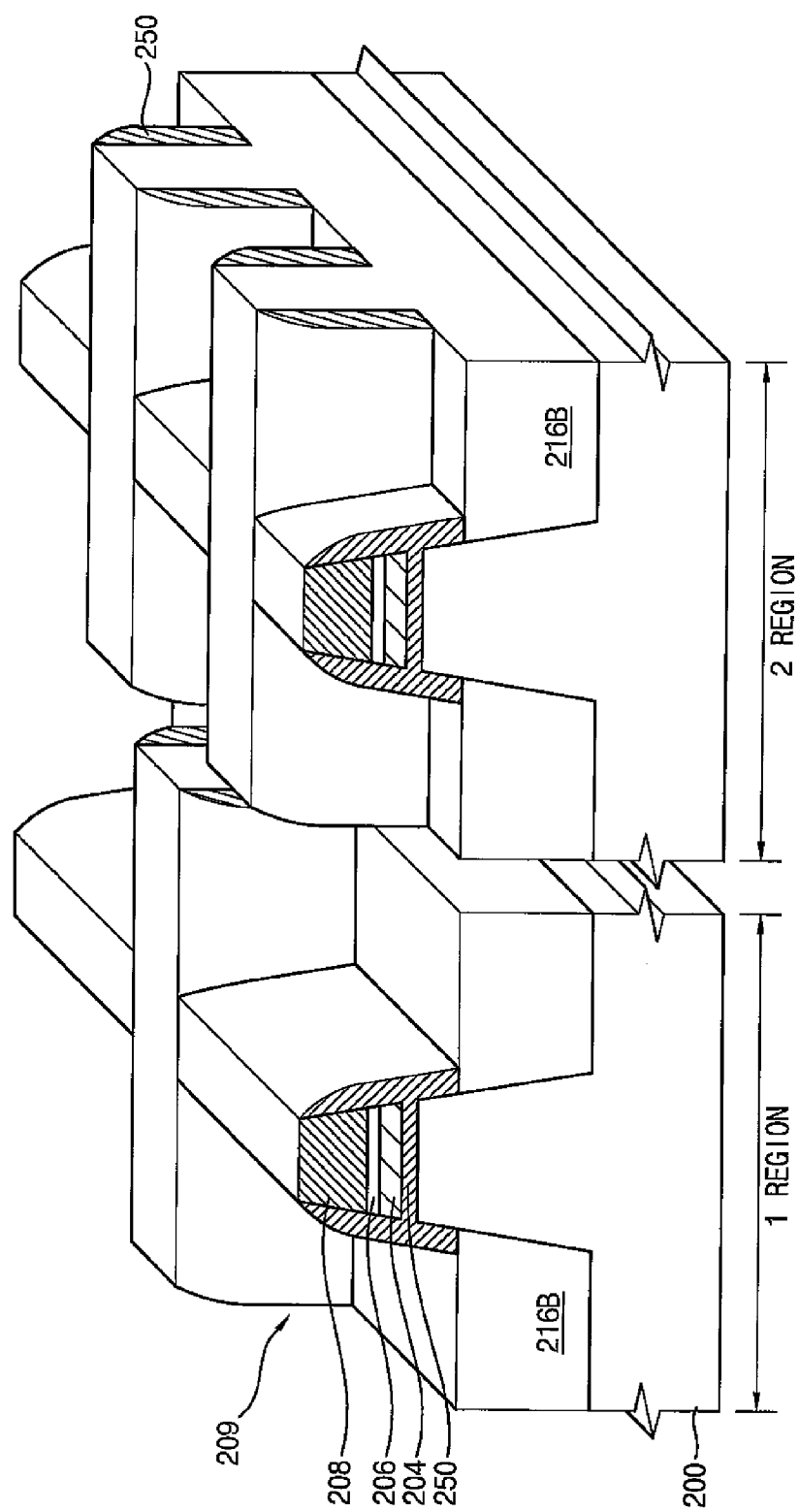
Figure 21:
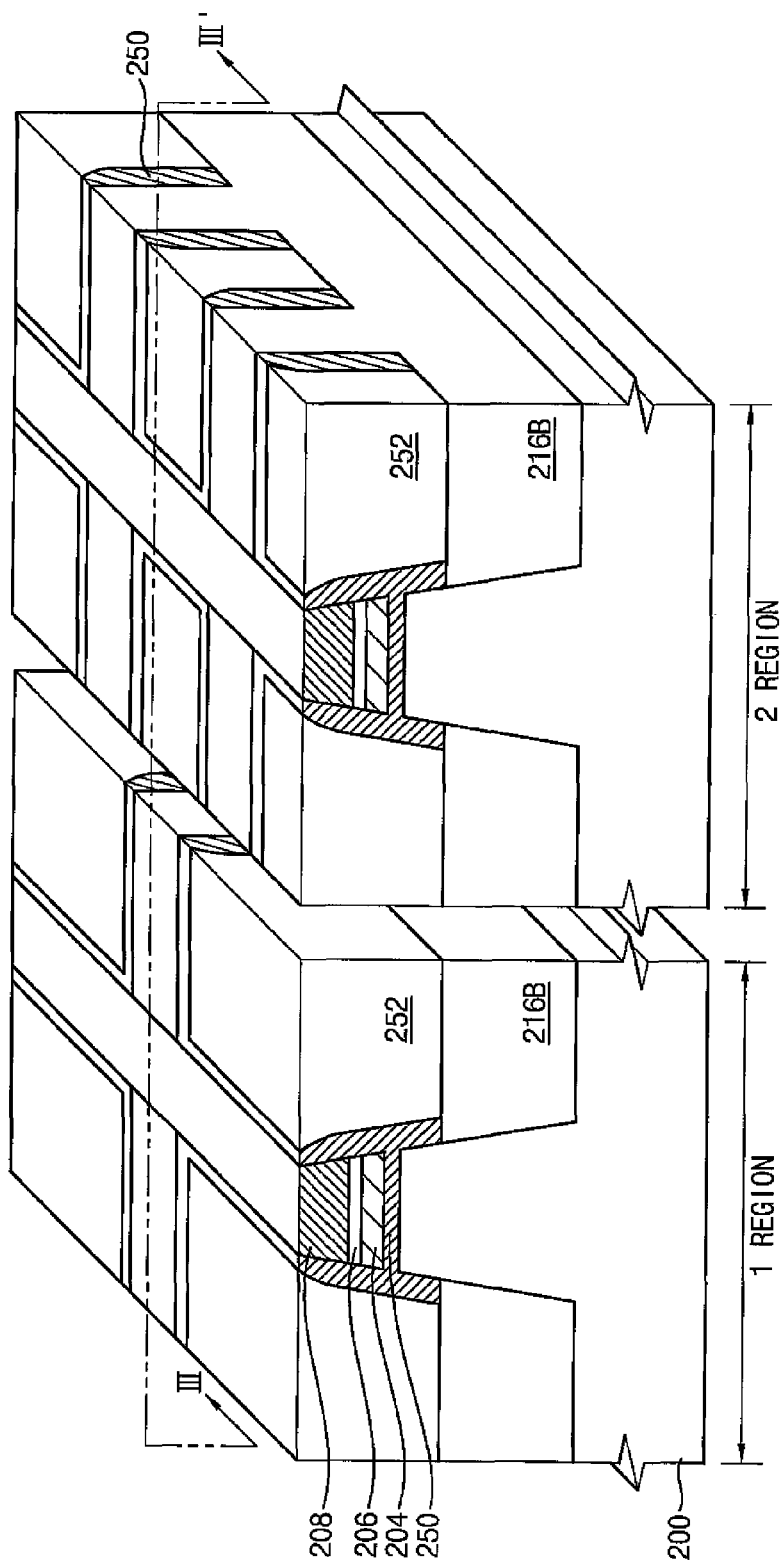
Figure 22:
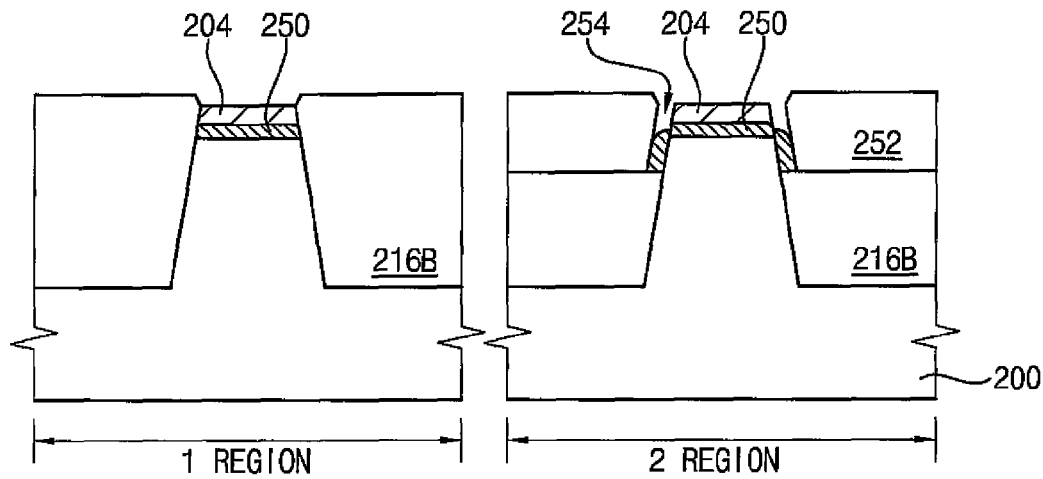
FIGS. 22 and 23 are cross-sectional views further illustrating the method of manufacture described in relation to FIGS. 19 to 21.
Figure 23:
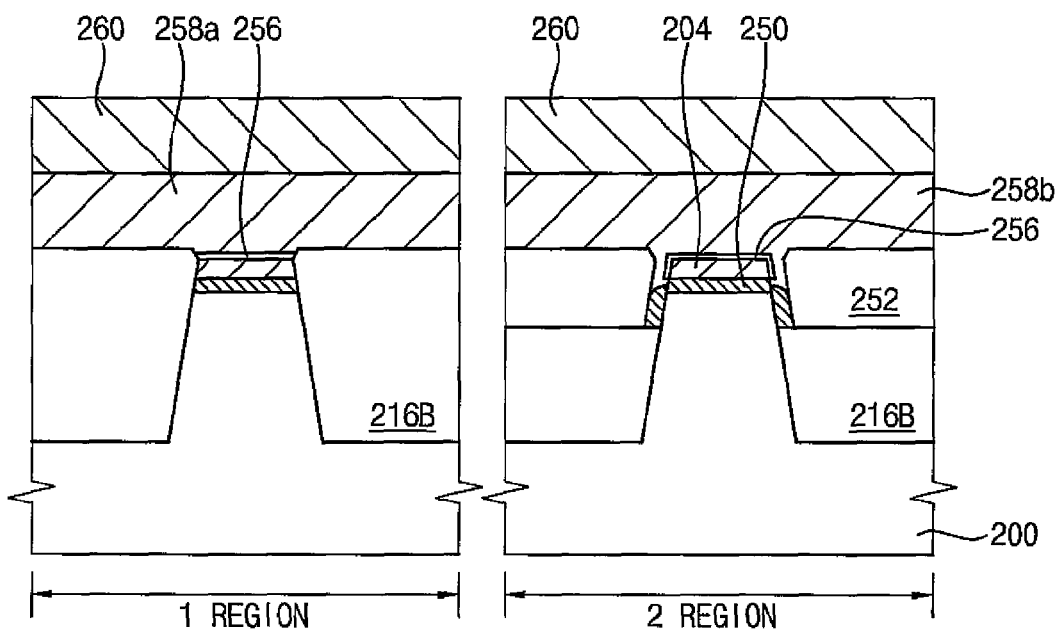

FIGS. 19 to 21 are perspective views illustrating a method of manufacturing a semiconductor device in accordance with another embodiment of the invention. FIGS. 22 and 23 are related cross-sectional views taken along a line III-III' of FIG. 21.

Referring to FIG. 19, the structure described in relation to FIG. 14 is formed using, for example, a method consistent with the description of FIGS. 9 to 14. Referring to the structure illustrated in FIG. 14, silicon nitride liner 224 completely fills the gap separating silicon substrate 200 and active layer 204. Accordingly, the active regions have a structure substantially similar to a transistor formed on a SOI substrate.

Referring to FIG. 20, an entire surface of the silicon nitride liner 224 is then anisotropically etched to form a spacer 250 on sidewalls of the isolation trench 209. During the anisotropic etching process forming spacer 250, the upper surface of first hard mask pattern 208 may be partially etched, to thereby reduce the thickness of first hard mask pattern 208.

Referring to FIG. 21, an isolating insulation layer (not shown) is formed on the first hard mask pattern 208 to fill over the low stepped portion of the first isolation layer 216B. Then, the isolation insulating layer is planarized until the surface of the first hard mask pattern 208 is exposed to form a second isolation layer 226.

FIGS. 22 to 23 are related cross-sectional views taken along a central portion of the gate electrode forming region of the first and second regions. Referring to FIG. 22, the first hard pattern 208 is completely removed, and then the spacer 250 is partially removed.

The first hard mask pattern 208 and the spacer 250 may be removed simultaneously by the same etching process. The etching process may be performed by a wet etching process using a dilute hydrofluoric acid (HF) solution.

By means of this process, an upper portion of the spacer 250 formed on the sidewalls of the isolation trench is etched to form an indentation 254. The sidewalls of the active layer on the first and second active layers are partially exposed by indentation 254. Here, the size of the sidewall portions of the active layer exposed may be defined by controlling the etching process forming the spacer 250.

In the illustrated embodiment, the silicon nitride liner does not remain on the first hard mask pattern 208 before performing the etching process. Further, the first hard mask pattern 208 has a thickness less than that of the first hard mask pattern in the second example embodiment. Therefore, the material thickness to be etched by the etching process may be decreased. As a result, the etching process may be more easily controlled.

Referring to FIG. 23, by performing processes substantially the same as those described with reference to FIG. 18, a planar type transistor including the stacked combination of gate oxide layer 256, first gate electrode 258a and second hard mask pattern 260 is formed in the first active region, and a fin type transistor including the stacked combination of gate oxide layer 256, second gate electrode 258b and second hard mask pattern 260 is formed in the second active region.

Figure 24:
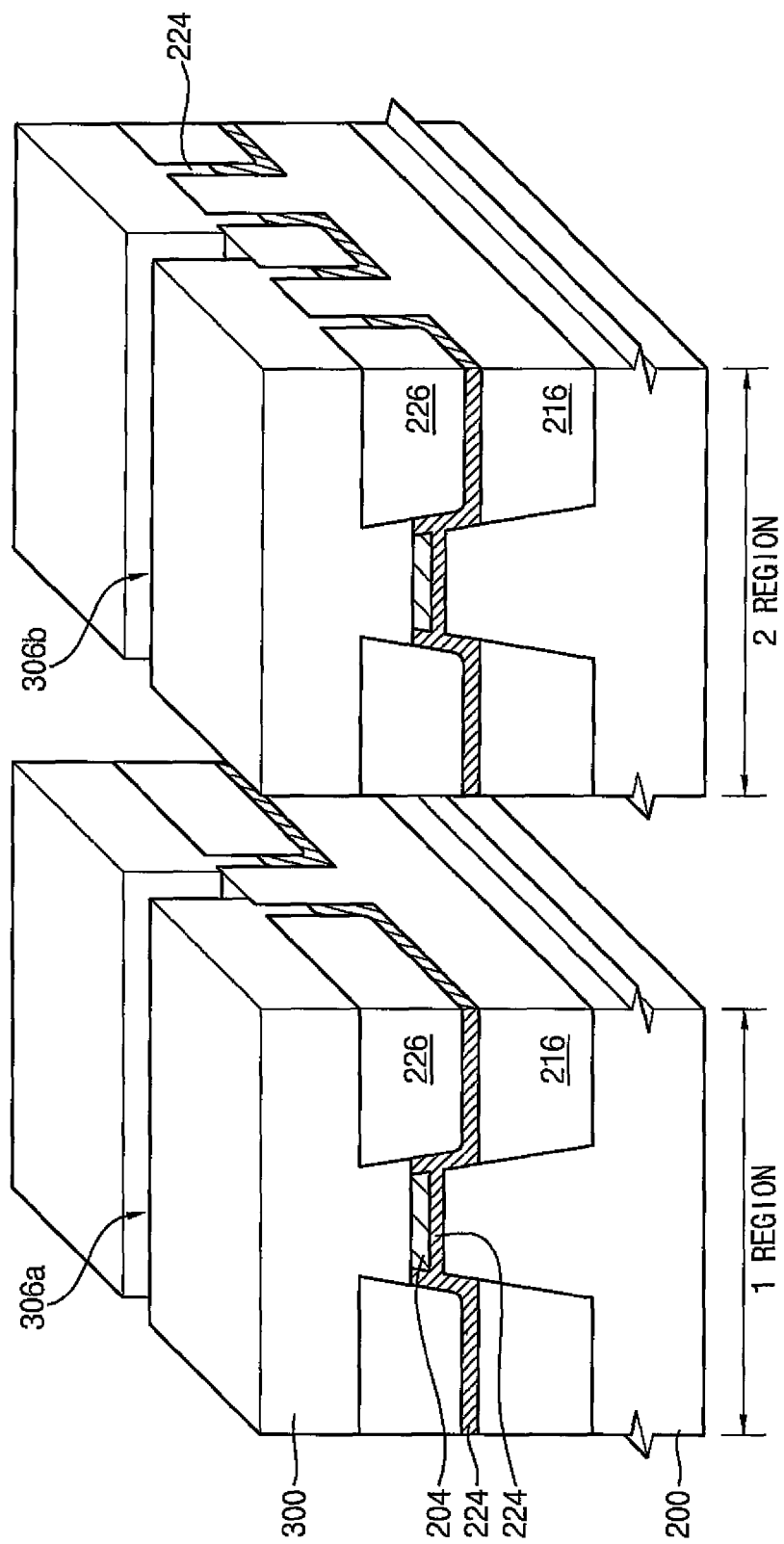
FIGS. 24 and 26 are perspective views illustrating a method of manufacturing a semiconductor device in accordance with another embodiment of the invention.
Figure 25:
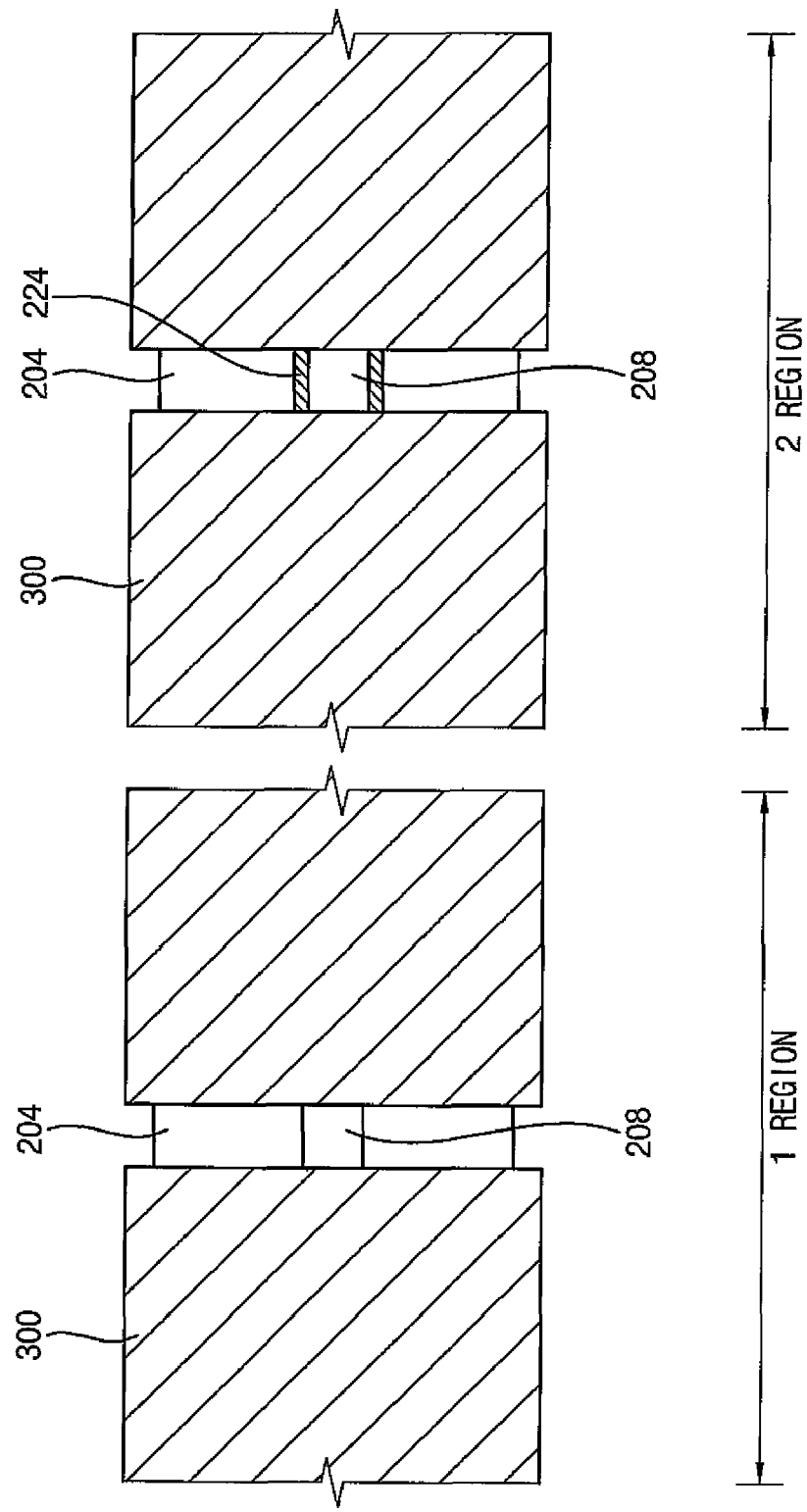
FIG. 25 is a plan view further illustrating the method of manufacture described in relation to FIGS. 24 and 26.
Figure 26:
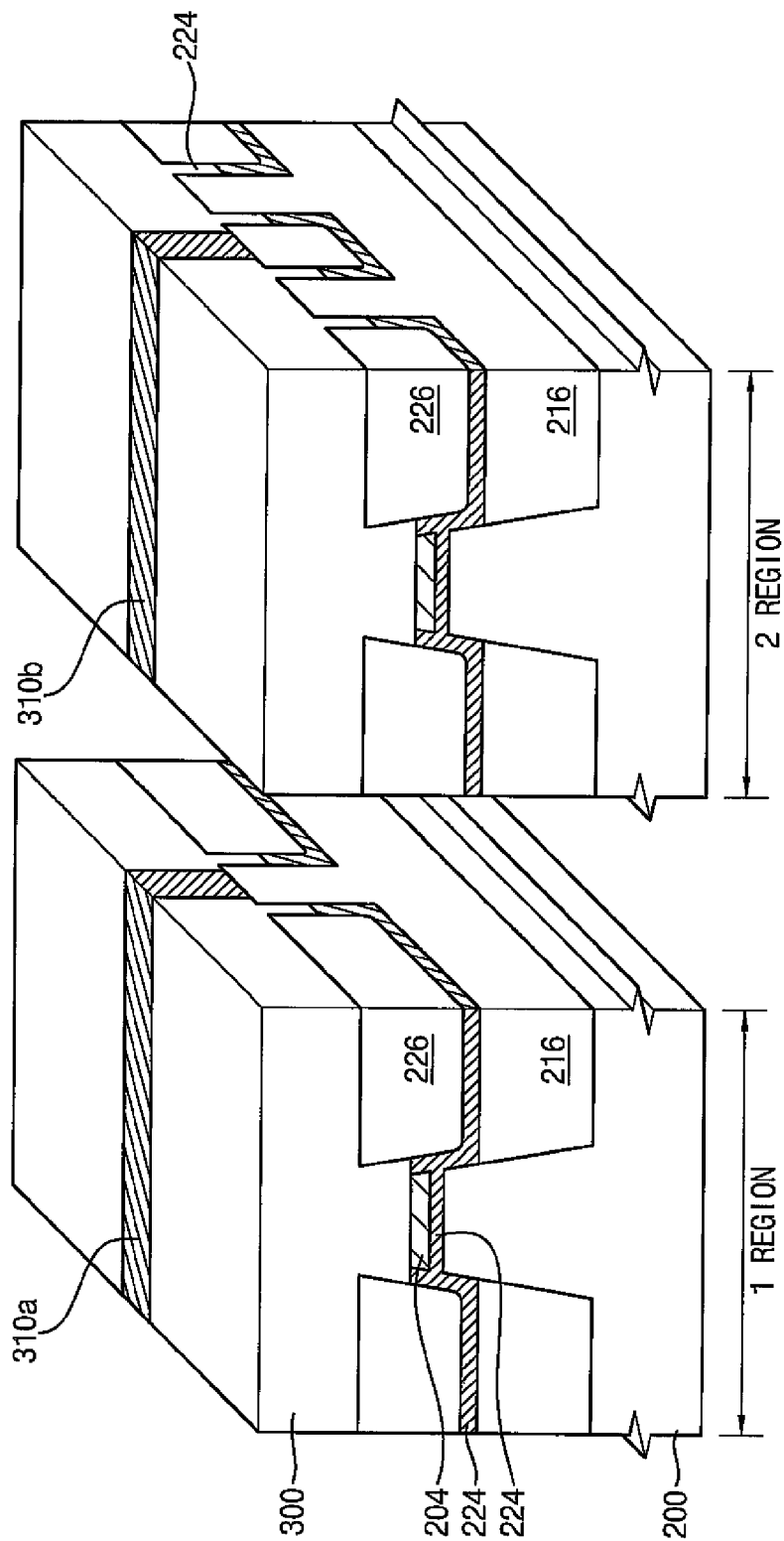

FIGS. 24 and 26 are perspective views illustrating a method of manufacturing a semiconductor device in accordance with another embodiment of the invention. FIG. 25 is a related plan view further illustrating the method of manufacture.

Referring to FIG. 24, the structure illustrated in FIG. 15 is using, for example, the sequence of fabrication processes described with reference to FIGS. 9 to 15.

Referring to the structure illustrated in FIG. 15, the first active region where a planar type transistor is formed and the second active region where a fin type transistor is formed are separated by the first and second isolation layers 216 and 226. Additionally, the silicon nitride liner 224 is formed on the first active region, the second active region and a portion of a surface of the first isolation layer 216.

Then, the exposed silicon nitride liner and the first hard mask pattern are successively etched. Here, the silicon nitride liner formed under the sidewalls of the pad oxide layer is not preferably removed by the etching process.

Further, the pad oxide layer is etched to expose the surface of the active layer. When the pad oxide layer is etched, the first and second isolation layers may be partially etched simultaneously. Accordingly, the respective heights of the first and second isolation layers may be decreased.

A mold layer (not illustrated) for forming the first and second gate electrodes is then formed on the first and second isolation layers. Preferably, the mold layer will have a height greater than that of the respective gate electrodes.

The mold layer will preferably include a material having an etch selectivity with respect to silicon material provided as the active layer 204. For example, when the gate electrode includes a metal material, the mold layer may be formed using polysilicon, silicon nitride, silicon oxide, etc. Alternatively, when the gate electrode may include polysilicon, the mold layer may be formed using silicon nitride, silicon oxide, etc.

The mold layer may be patterned using conventional photolithography and etching processes to form a mold layer pattern 300 that selectively exposes regions where the first and second gate electrodes are to be formed. That is, trenches 306a and 306b for exposing the gate region are formed between the mold layer patterns 300. Hereinafter, a trench formed in the first active region is referred to as a first trench 306a, and a trench formed in the second active region is referred to as a second trench 306b, respectively.

Although not illustrated in figures, a spacer may additionally be formed on sidewalls of the mold layer pattern 300 in order to reduce inner widths of the first and second trenches 306a and 306b. When the spacer is additionally formed, a gate electrode having a line width narrower than that of the gate electrode patterned by a photolithography process may be formed.

Referring to FIG. 25, the silicon nitride liner is not exposed through the first trench. On the other hand, the silicon nitride liner is exposed through the second trench. The silicon nitride liner exposed through the second trench is partially removed to form an indentation on both side portions of the active layer. Accordingly, the sidewalls of the active layer 204 in the second active region are partially exposed.

Referring to FIG. 26, a gate oxide layer (not illustrated) may be formed on surfaces of the active layer 204, which are exposed through the first and second trenches 306a and 306b. The surfaces of the exposed active layer 204 may be oxidized to form the gate oxide layer. Alternatively, the gate oxide layer may be formed using a metal oxide having a high dielectric constant.

Then, the indentation and the inner portions of the first and second trenches 306a and 306b are filled with a gate conductive layer (not illustrated).

The gate conductive layer may be formed from metal, such as titanium nitride, tantalum nitride, tungsten, etc. Alternatively, the gate conductive layer may be formed using doped polysilicon.

Then, the gate conductive layer is planarized until the upper surface of the mold layer pattern 300 is exposed to form first and second gate electrodes 310a and 310b in the inner portions of the first and second trenches 306a and 306b, respectively.

Because the indentation is not formed on a lower surface of the first trench 306a, the first gate electrode 310a is formed only the upper surface of the active layer 204. Therefore, the first gate electrode 306a serves as a gate of the planar type transistor. On the other hand, because the indentation is formed on both side portions of the active layer 204 under the second trench 306b, the second gate electrode 310b is formed on the upper surface and the sidewalls of the active layer 204. Therefore, the second gate electrode 310b serves as a gate of a fin type transistor.

Other methods of manufacturing a semiconductor device in accordance with an embodiment of the present invention may incorporate aspects from the foregoing descriptions.

For example, the silicon nitride liner may be anisotropically etched to form a spacer on the sidewalls of the isolation trench by processes substantially the same as the processes described in relation to FIG. 15. Then, the first and second gate electrodes are patterned using a mold layer pattern substantially the same as the mold layer pattern described in relation to FIG. 24.

Alternatively, the silicon nitride liner remains on the sidewalls of the active layer, and the height of the isolation layer adjacent to the active layer is decreased so as to form a fin type transistor in the first region and a planar type transistor in the second region.

Figure 27:
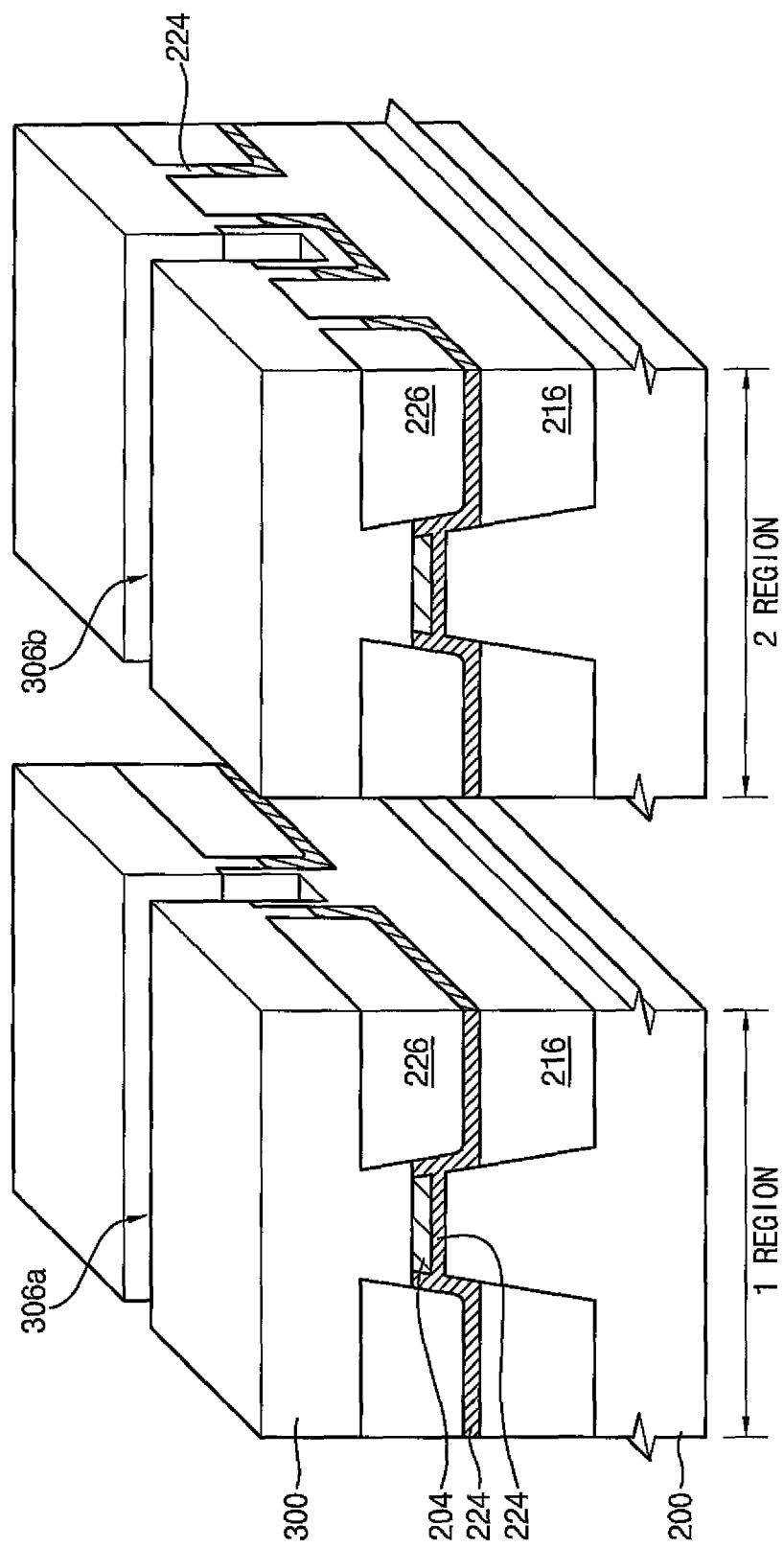
FIGS. 27 and 28 are perspective views illustrating a method of manufacturing a semiconductor device in accordance with another embodiment of the invention.
Figure 28:
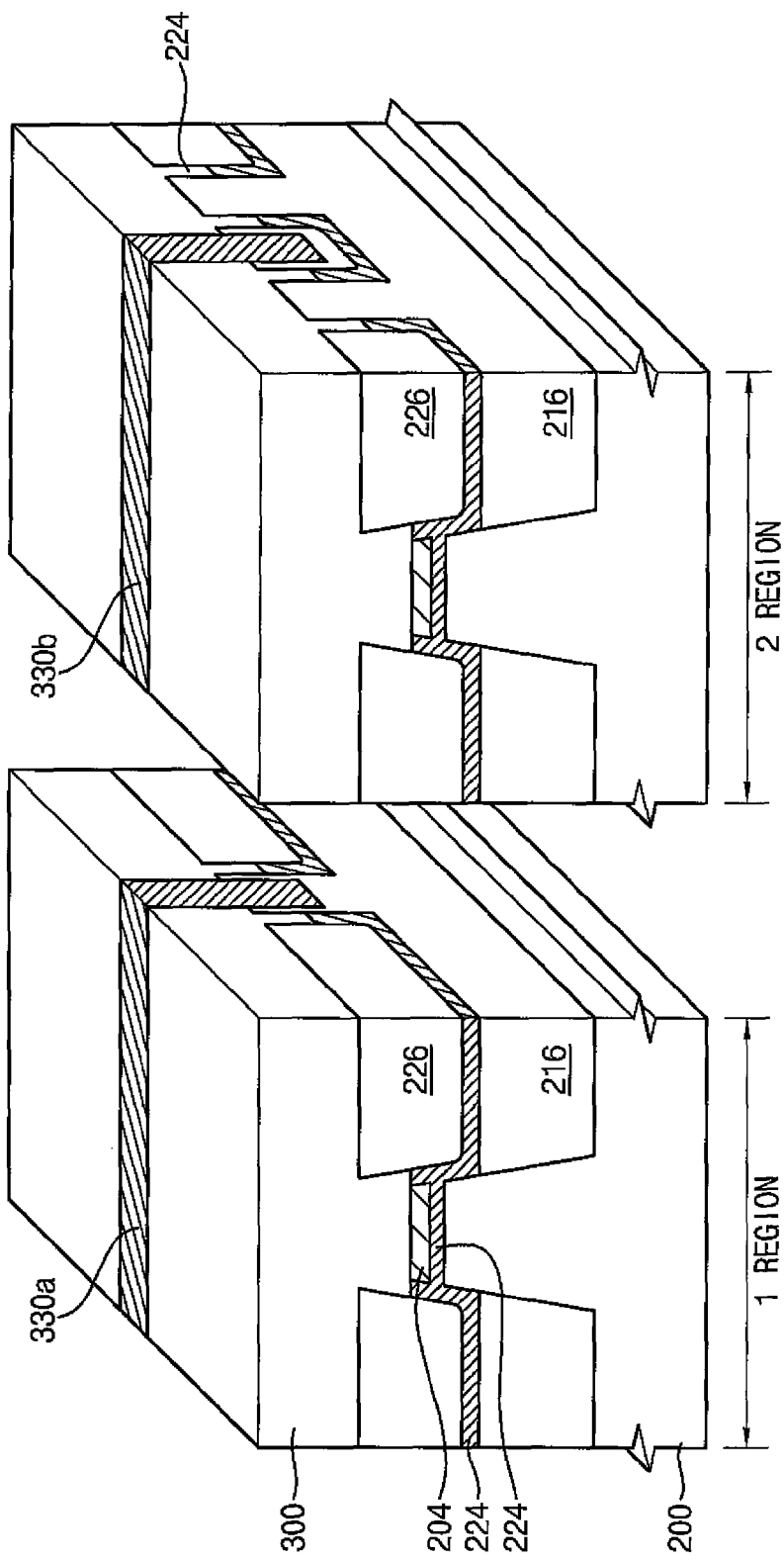
Figure 29:
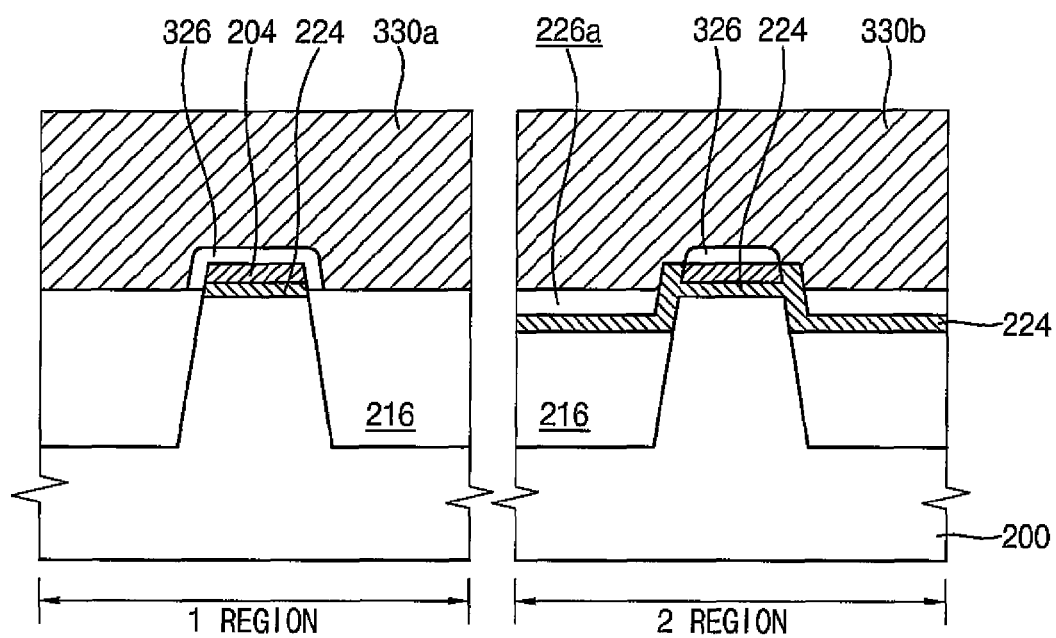
FIG. 29 is a cross-sectional view further illustrating the method of manufacture described in relation to FIGS. 27 and 28.

FIGS. 27 and 28 are perspective views illustrating a method of manufacturing a semiconductor device in accordance with another embodiment of the invention. FIG. 29 is a related cross-sectional view.

A description of the illustrated embodiment begins with the structure illustrated in FIG. 24 which may be formed as previously outlined.

Referring to the structure illustrated in FIG. 24, the mold layer pattern 300 selectively exposing regions where gate electrodes are to be formed in the first and second active regions is formed on the substrate 200. The trenches 306a and 306b that selectively expose the gate region are formed in the gap portions between the mold layer patterns 300. Hereinafter, a trench formed in the first active region is referred to as a first trench 306a, and a trench formed in the second active region is referred to as a second trench 306b, respectively.

Here, the upper surface of the silicon nitride liner 224 is not exposed through the first trench 306a. On the other hand, the upper surface of the silicon nitride liner 224 is exposed through the second trench 306b.

Referring to FIG. 27, the exposed first and second isolation layers 216, 226 are partially removed using a conventional etching process. Accordingly, the heights of the upper surfaces of the first and second exposed isolation layers 216 and 226 are slightly decreased. Here, as the first and second exposed isolation layers 216 and 226 are partially removed, the sidewalls of the active layer 204 in the first active region are exposed.

On the other hand, because the silicon nitride liner is formed on both sides of the active layer 204 disposed in the second active region, the sidewalls of the active layer is not exposed, although the second isolation layer 226 is removed.

Referring to FIGS. 28 and 29, a gate oxide layer 326 is formed on the surface of the active layer exposed through the first and second trenches 306a and 306b. The surface of the exposed active layer 204 may be oxidized to form the gate oxide layer 326. Alternatively, the gate oxide layer 326 may be formed using metal oxide having a high dielectric constant.

Then, the etched portion of the first and second isolation layers 216 and 226, and the inner portion of the first and second trenches 306a and 306b are filled with a gate conductive layer (not illustrated).

The gate conductive layer may be formed from a metal, such as titanium nitride, tantalum nitride, tungsten, etc. Alternatively, the gate conductive layer may be formed from doped polysilicon.

Then, the gate conductive layer is planarized until the upper surface of the mold layer pattern 300 is exposed to form first and second gate electrodes 330a and 330b on the inner portion of the first and second trenches 306a and 306b, respectively. Here, the gate oxide layer 326 and the first gate electrode 330a are formed on the upper surface and the both sidewalls of the active layer 204 exposed through the first trench 306a. Therefore, the first gate electrode 330a serves as a gate of a fin type transistor.

However, because the silicon nitride liner 224 remains on the both sidewalls of the active layer 204 exposed through the second trench, the gate oxide layer 326 and the second gate electrode 330b are formed only on the upper surface of the active layer 204. Therefore, the second gate electrode 330b serves as a gate of a planar type transistor.

A method of manufacturing a semiconductor device in accordance with another embodiment of the invention may be substantially similar to this embodiment except that the silicon nitride liner is further anisotropically etched to form a spacer on the sidewalls of the isolation trench after the silicon nitride liner is formed.

In another embodiment the structure illustrated in FIG. 15 is used as a beginning point. Then, the exposed silicon nitride liner and the hard mask pattern are successively etched. Here, the silicon nitride liner formed on the lower sidewalls of the pad oxide layer is not preferably removed by the etching process. The pad oxide layer is etched to expose the surface of the active layer.

The first and second exposed isolation layers are partially removed by an etching process, and thus the upper surface of the first and second isolation layers is disposed lower than the active layer. The first and second exposed isolation layers are etched to expose the sidewalls of the active layer in the first region.

On the other hand, as the silicon nitride liner is formed on the both sides of the active layer on the second active region, the sidewalls of the active layer is not exposed when the second isolation layer is removed.

Then, a gate oxide layer is formed on the surface of the active layer. After a conductive layer and a hard mask pattern are formed, the gate conductive layer is etched using the hard mask pattern as an etching mask to form first and second gate patterns in the first and second regions, respectively.

Here, the gate oxide layer and the first gate electrode are formed on the both sidewalls of the active layer in the first region. Therefore, the first gate electrode serves as a gate having a fin type transistor.

On the other hand, because the silicon nitride liner still remains on the both sidewalls of the active layer 204 in the second region, the gate oxide layer and the second gate electrode are formed only on the upper surface of the active layer. Therefore, the second gate electrode serves as a gate having a planar type transistor.

Other embodiments of the invention may further anisotropically etch the silicon nitride liner in the foregoing structure to form a spacer on the sidewalls of the isolation trench after forming the silicon nitride liner.

Figure 30:
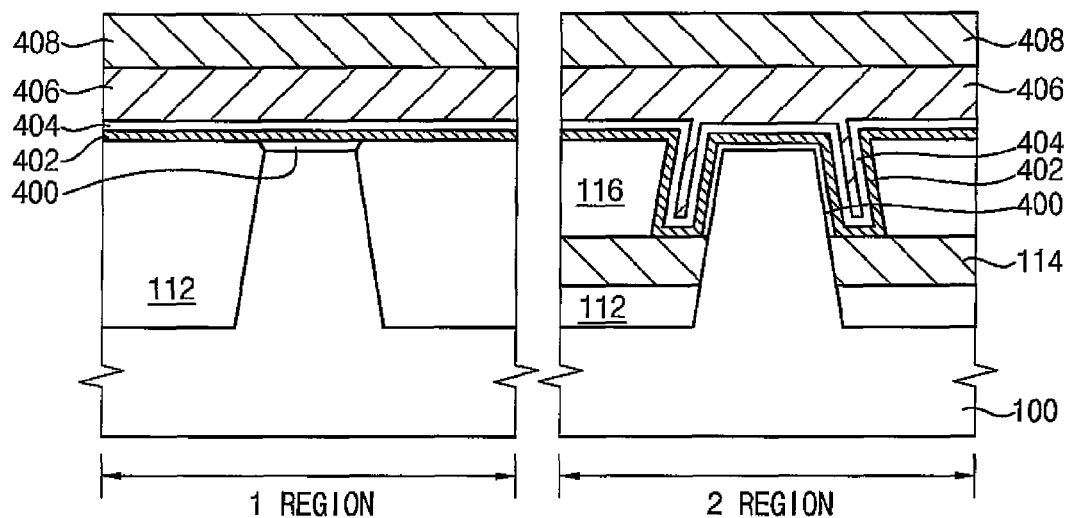
FIG. 30 is a cross-sectional view illustrating a method of manufacturing a semiconductor device in accordance with another embodiment of the invention.

FIG. 30 is a cross-sectional view illustrating a method of manufacturing a semiconductor device in accordance with another embodiment of the invention. Hereinafter, the semiconductor device of this example embodiment corresponds to a charge trap type non-volatile memory device which is operationally different from the foregoing embodiments drawn to volatile memory devices.

To begin, processes substantially similar to those described in FIGS. 1 to 7 are performed to partially expose an upper surface of the substrate in the active region.

Referring to FIG. 30, a tunnel oxide layer 400 is formed on the exposed upper surface and the sidewalls of the substrate. The surface of the substrate in the exposed first and second active regions may be oxidized to form the tunnel oxide layer 400. A charge trap layer 402 is then formed on the tunnel oxide layer 400. The charge trap layer 402 may be formed from a silicon nitride layer, a metal oxide layer, etc. Then, a dielectric layer 404 is formed on the charge trap layer.

After the tunnel oxide layer 400, charge trap layer 402 and dielectric layer 404 are formed on the substrate, a residual inner portion of the constituent indentation should not be completely filled. Accordingly, the width of the indentation may be more than twice a total thickness of the tunnel oxide layer 400, charge trap layer 402 and dielectric layer 404. Therefore, a thickness of the silicon nitride layer used to form the indentation may be more than twice the total thickness of the tunnel oxide layer 400, charge trap layer 402 and dielectric layer 404.

A conductive layer 406 is then formed on the dielectric layer 404. The conductive layer may be formed using polysilicon doped with impurities by an LPCVD process. Alternatively, the conductive layer may be formed using a metal material. In addition, the conductive layer may be formed by stacking polysilicon doped with impurities and the metal material.

After a hard mask pattern 408 is formed on the conductive layer 406, the conductive layer 406, dielectric layer 404 and charge trap layer 402 are successively etched using the hard mask pattern 408 as an etching mask to form a gate electrode 406, a dielectric layer pattern 404 and a charge trap layer pattern 402.

Then, impurities are implanted through a surface of the substrate, which is exposed through both sides of the gate electrode 406 to form source/drain regions (not illustrated).

As a result, because the indentation is formed in the second active region, a cell including a fin type non-volatile memory device may be formed. Further, a cell including a planar type non-volatile memory device may be formed.

Figure 31:
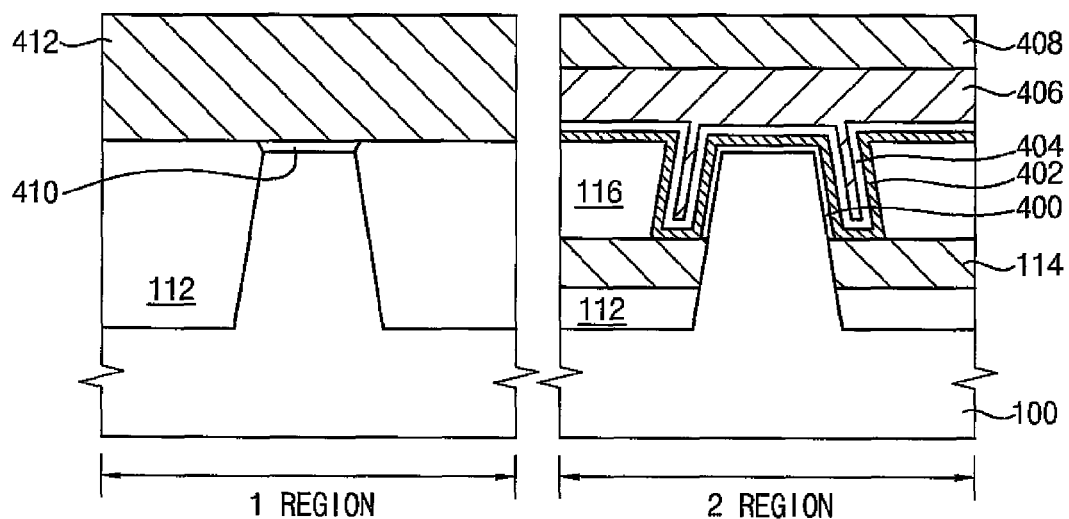
FIG. 31 is a cross-sectional view illustrating a method of manufacturing a semiconductor device in accordance with another embodiment of the invention.

FIG. 31 is a cross-sectional view illustrating a method of manufacturing a semiconductor device in accordance with another embodiment of the invention.

Hereinafter, another method of manufacturing a semiconductor device consistent with the foregoing, having a first substrate region wherein a planar type MOS transistor is formed and a second substrate region wherein a fin type non-volatile memory device is formed, will be described.

Referring to FIG. 31, after the processes described above in relation to FIG. 30 are carried out, tunnel oxide layer 400, charge trap layer 402 and dielectric layer 404 formed in the first active region are removed from the substrate.

Then, after the substrate of the first active region is oxidized to form a gate oxide layer 410, a gate electrode 412 is formed on the gate oxide layer 410. Impurities are implanted in the first active region to form source/drain regions (not illustrated).

Thus, according to the processes described with reference to FIG. 31, the formation of the indentation is not carried out in the first active region. Therefore, the planar type MOS transistor is formed in the first active region. On the other hand, because the indentation is formed in the second active region, the cell of the fin type non-volatile memory device is formed in the second active region.

Figure 32:
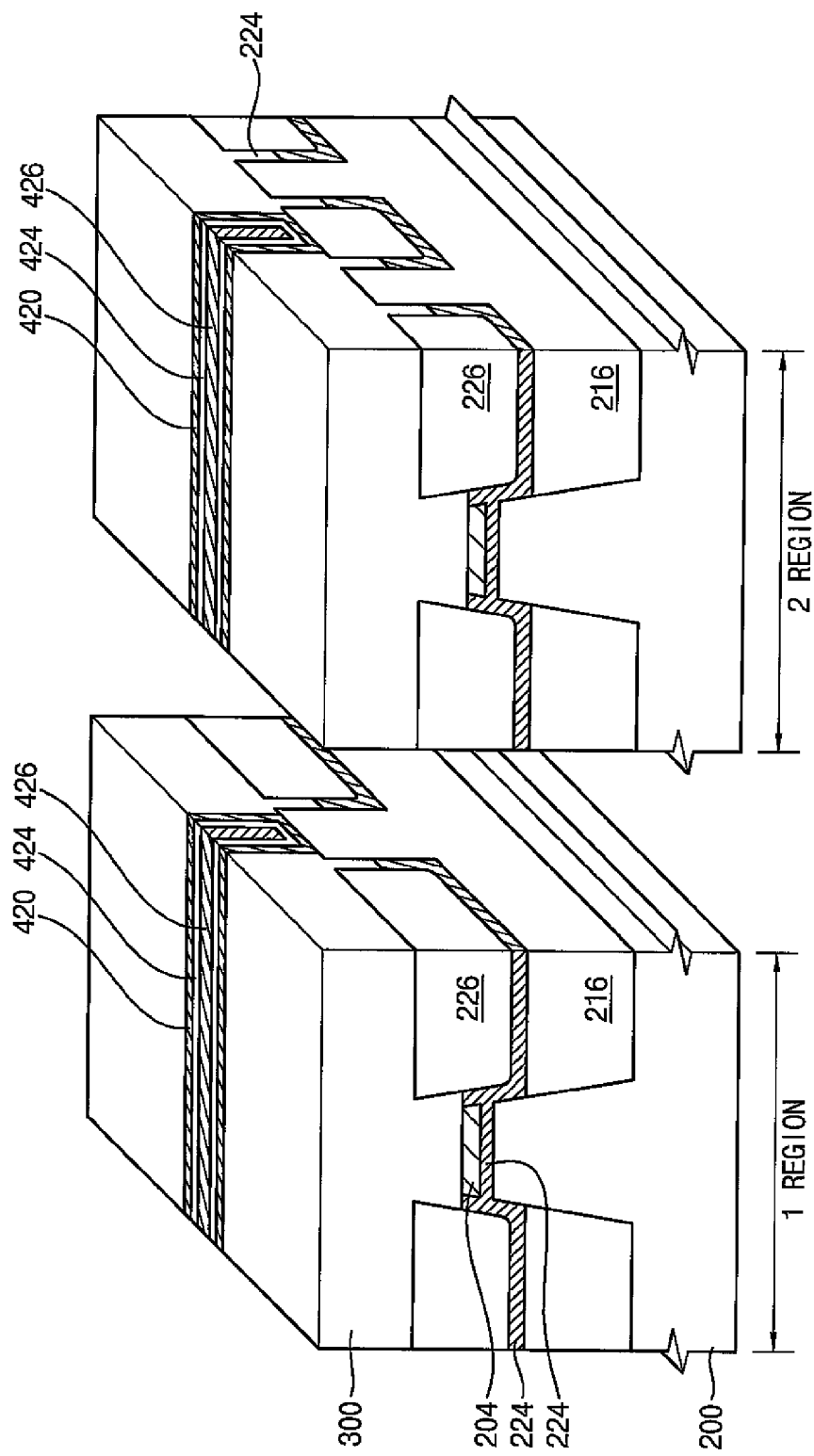
FIG. 32 is a cross-sectional view illustrating a method of manufacturing a semiconductor device in accordance with another embodiment of the invention.

FIG. 32 is a cross-sectional view illustrating a method of manufacturing a semiconductor device in accordance with another embodiment of the invention.

First, after performing processes substantially the same as those described in relation to FIGS. 24 to 25, an upper surface of the substrate in the active region is exposed in the first region, and upper and sidewall surfaces of the substrate in the active region are partially exposed in the second region.

Referring to FIG. 32, the surface of the exposed active layer 204 may be oxidized to form the tunnel oxide layer. Here, the tunnel oxide layer is also formed on the active layer 204 at sidewalls which are exposed in the second region. A charge trap layer is formed on the tunnel oxide layer. The charge trap layer may include a silicon nitride layer, a metal oxide layer, etc. Then, a dielectric layer is formed on the charge trap layer.

After the tunnel oxide layer, charge trap layer, and dielectric layer are formed on the substrate, the constituent indentation should still not be completely filled.

A conductive layer is then formed on the dielectric layer. The conductive layer may be formed using polysilicon doped with impurities by a LPCVD process. Alternatively, the conductive layer may be formed using a metal material. Additionally, the conductive layer may be formed by stacking polysilicon doped with impurities and the metal material.

After the conductive layer, the dielectric layer and the charge trap layer are planarized until an upper surface of the mold layer pattern 300 is exposed to form a gate electrode 426, a dielectric layer pattern 424 and a charge trap layer pattern 420.

Then, impurities are implanted through a surface of the active layer exposed through both sides of the gate electrode 426 to form source/drain regions.

Although not illustrated in figures a cell of a non-volatile memory device may not be formed in the first active region, and a cell of a non-volatile memory device may be formed only in the second active region. Further, a planar type MOS transistor including the gate oxide layer pattern and the gate electrode, which is formed on the gate oxide layer, and source/drain regions may be formed in the first active region.

Figure 33:
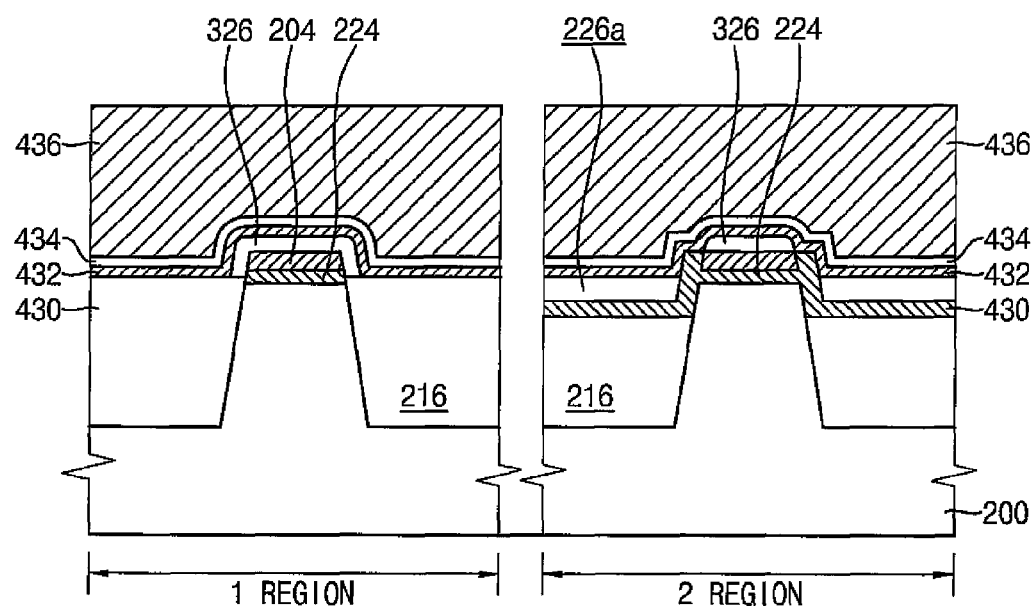
FIG. 33 is a cross-sectional view illustrating a method of manufacturing a semiconductor device in accordance with another embodiment of the invention.

FIG. 33 is a cross-sectional view illustrating a method of manufacturing a semiconductor device in accordance with another embodiment of the invention.

Firstly, after processes substantially the same as those described in FIG. 27 are carried out, an upper surface of the substrate in the active region is exposed in the first region, and an upper surface and sidewalls of the substrate in the active region are partially exposed in the second region.

Referring to FIG. 33, the surface of the exposed active layer 204 may be oxidized to form the tunnel oxide layer 430. Here, the tunnel oxide layer 430 is also formed on the active layer 204 disposed at sidewalls that are externally exposed in the first region. A charge trap layer (not illustrated) is formed on the tunnel oxide layer 430. The charge trap layer may include a silicon nitride layer, a metal oxide layer, etc. Then, a dielectric layer (not illustrated) is formed on the charge trap layer.

A conductive layer is formed on the dielectric layer. The conductive layer may be formed using polysilicon doped with impurities by a LPCVD process. Alternatively, the conductive layer may be formed using a metal material. Additionally, the conductive layer may be formed by stacking polysilicon doped with impurities and the metal material.

After the conductive layer, the dielectric layer and the charge trap layer are planarized until an upper surface of the mold layer pattern is exposed to form a gate electrode 436, a dielectric layer pattern 434 and a charge trap layer pattern 432.

Then, impurities are implanted through a surface of the active layer exposed through both sides of the gate electrode 436 to form source/drain regions.

In the foregoing, a cell for a non-volatile memory device need not be formed in the second active region, but may only be formed for a fin type non-volatile memory device in the first active region. Also, a planar type MOS transistor including the gate oxide layer pattern and the gate electrode formed on the gate oxide layer, and a source/drain region may be formed in the second active region.

In different embodiments of the invention, processes substantially the same as those described in FIGS. 2, 3, 5 and 7 to 9 may be carried out to form a pattern structure where an upper surface of the substrate in the active region may be exposed in the first region and an upper surface and sidewalls of the substrate in the active region may be partially exposed in the second region.

In addition, a tunnel oxide layer a charge trap layer pattern, a dielectric layer pattern and a gate electrode may be patterned on the substrate structure formed according to the foregoing embodiments of the invention in order to fabricate a charge trap type non-volatile memory device.

As mentioned above, in the case of forming a fin charge type non-volatile memory cell, the upper and sidewall surfaces of the substrate in the active region may be used as an active element. Therefore, although the horizontal dimension of the active region is reduced, the amount of charge trapped in the charge trap layer may nonetheless be increased. Thus, a data retention time for the nonvolatile memory device may be increased.

According to the present invention, a planar type transistor and a fin type transistor may be formed in each different region of a substrate using a simpler process. Particularly after the SOI structure is formed using the bulk silicon substrate, the planar type transistor and the fin type transistor may be respectively formed in each of the regions. As a result, a semiconductor device having high efficiency may be formed at a small outlay compared with using the SOI substrate.

Additionally, a fin type, charge trap non-volatile memory device may be formed using a simpler process. As the charge trapped by the charge trap layer increases, the fin type, charge trap type non-volatile memory device exhibit excellent operating properties.

The foregoing is illustrative of the present invention and is not to be construed as limiting thereof. Although a few example embodiments of the present invention have been described, those skilled in the art will readily appreciate that many modifications are possible in the example embodiments without materially departing from the teachings of the present invention. Accordingly, all such modifications are intended to be included within the scope of the present invention as defined in the claims.

What is claimed is:

1. A method of manufacturing a semiconductor device, comprising:
    forming a sacrificial layer and an active layer on a substrate having a first region and a second region;
    partially etching the sacrificial layer, the active layer and the substrate to form an isolation trench defining an isolation region and an active region;
    partially filling the isolation trench with a first isolation layer, the first isolation layer in the first region having a step height greater than side portions of a gate region and the first isolation layer in the second region having a step height greater than the gate region;
    removing the sacrificial layer to form an opening separating the substrate and the active layer;

forming an insulating layer liner along the first isolation layer, sidewalls of the isolation trench and the active layer to fill the opening;
completely filling the isolation trench with a second isolation layer;
partially removing the insulating layer liner to expose an upper surface of the active layer in the gate region of the first region and the upper and sidewall surfaces of the active layer in the gate region of the second region; and
forming a gate oxide layer and a gate electrode on the exposed active layer.

2. The method of claim 1, wherein the sacrificial layer comprises silicon germanium and the active layer comprises single crystalline silicon.

3. The method of claim 2, wherein the sacrificial layer and the active layer are formed by an epitaxial growth process.

4. The method of claim 1, wherein forming the first isolation layer comprises:
filling the isolation trench with a preliminary isolation layer;
forming a first mask pattern and a second mask pattern on the preliminary isolation layer, the first mask pattern masking the gate region in the first region, the second mask pattern masking the side portions of the gate region in the second region; and
partially etching the preliminary isolation layer using the first and second mask patterns as etching masks until the sacrificial layer is exposed through the sidewalls of the isolation trench to form the first isolation layer.

5. The method of claim 1, further comprising:
forming a pad oxide layer on an inner surface of the opening after removing the sacrificial layer to form the opening.

6. The method of claim 1, further comprising:
anisotropically etching the insulating layer liner to form a first spacer on the sidewalls of the isolation trench after forming the insulation layer liner.

7. The method of claim 1, wherein the sacrificial layer is removed by a wet etching process.

8. The method of claim 1, wherein forming the gate oxide layer and the gate electrode on the exposed active layer comprises:
forming the gate oxide layer on the exposed active layer;
forming a conductive layer for a gate electrode and a hard mask pattern on the substrate including the gate oxide layer; and
etching the conductive layer using the hard mask pattern as an etching mask to form the gate electrode.

9. The method of claim 1, wherein forming the gate oxide layer on the exposed active layer comprises:
forming a mold layer on the exposed active layer;
partially etching the mold layer to form a mold layer pattern having a trench that exposes the active layer in a gate electrode region;
forming the gate oxide layer on a surface of the active layer exposed through the trench;
forming a conductive layer for the gate electrode on the mold layer pattern to fill the trench with; and
planarizing the conductive layer for the gate electrode until an upper surface of the mold layer pattern is exposed to form the gate electrode.

10. The method of claim 9, further comprising:
forming a second spacer on sidewalls of the mold layer pattern.

11. The method of claim 1, wherein the insulating layer liner comprises silicon nitride.

12. A method of manufacturing a semiconductor device, comprising:
forming a sacrificial layer and an active layer on a substrate having a first region and a second region;
etching the sacrificial layer, the active layer and the substrate to form an isolation trench defining an isolation region and an active region;
partially filling the isolation trench with a first isolation layer, the first isolation layer in the first region having a step height greater than side portions of a gate region and the first isolation layer in the second region having a step height greater than the gate region;
removing the sacrificial layer to form an opening separating the substrate and the active layer;
forming an insulation layer liner along the first isolation layer, sidewalls of the isolation trench and the active layer to fill the opening;
completely filling the isolation trench with a second isolation layer;
partially removing the insulating layer liner to expose only an upper surface of the active layer in the gate region of the first and second regions, the insulating layer liner still remaining on sidewalls of the active layer;
partially etching the first and second isolation layers to expose the sidewalls of the active layer in the first region and the insulation layer liner remaining on the sidewalls of the active layer in the second region; and
forming a gate oxide layer and a gate electrode on the exposed active layer.

13. The method of claim 12, further comprising:
anisotropically etching the insulating layer liner to form a spacer on the sidewalls of the isolation trench after forming the insulation layer liner.

14. The method of claim 12, wherein forming the gate oxide layer and the gate electrode on the exposed active layer comprises:
forming the gate oxide layer on the exposed active layer;
forming a conductive layer for a gate electrode and a hard mask pattern on the substrate including the gate oxide layer; and
etching the conductive layer using the hard mask pattern as an etching mask to form the gate electrode.

15. The method of claim 12, wherein forming the gate oxide layer and the gate electrode on the exposed active layer comprises:
forming a mold layer on the exposed active layer;
partially etching the mold layer to form a mold layer pattern having a trench that exposes the active layer of the gate electrode region;
forming the gate oxide layer on a surface of the active layer exposed through the trench;
forming a conductive layer for the gate electrode on the mold layer pattern to fill the trench; and
planarizing the conductive layer for the gate electrode until an upper surface of the mold layer pattern is exposed to form the gate electrode.

16. The method of claim 12, wherein the insulating layer liner comprises silicon nitride.

17. A method of manufacturing a semiconductor device, comprising:
forming a sacrificial layer and an active layer on a substrate;
partially etching the sacrificial layer, the active layer and the substrate to form an isolation trench defining an isolation region and an active region;

partially filling the isolation trench with a first isolation layer, the first isolation layer having a step height greater than a gate region;

removing the sacrificial layer to form an opening separating the substrate and the active layer;

forming an insulation layer liner along the first isolation layer, sidewalls of the isolation trench and the active layer to fill the opening;

completely filling the isolation trench with a second isolation layer;

partially removing the isolation layer liner to expose upper and sidewall surfaces of the active layer in the gate region; and forming a tunnel oxide layer, a charge trap layer pattern and an electrode on the exposed active layer.

18. A method of manufacturing a semiconductor device, comprising:

forming a sacrificial layer and an active layer on a substrate having a first region and a second region;

partially etching the sacrificial layer, the active layer and the substrate to form an isolation trench defining an isolation region and an active region;

partially filling the isolation trench with a first isolation layer, the first isolation layer in the first region having a step height greater than side portions of a gate region, the first isolation layer in the second region having a step height greater than the gate region;

removing the sacrificial layer to form an opening separating the substrate and the active layer;

forming an insulation layer liner along the first isolation layer, sidewalls of the isolation trench and the active layer to fill the opening;

completely filling the isolation trench with a second isolation layer;

partially removing the insulation layer liner to expose only the upper surface of the active layer in the gate region of the first and second regions, leaving the insulation layer liner remaining on the sidewall surfaces of the active layer;

partially removing the first and second isolation layers to expose the sidewall surfaces of the active layer in the first region and the insulation layer liner left on the sidewall surfaces of the active layer in the second region; and forming a tunnel oxide layer, a charge trap layer pattern and an electrode on the exposed active layer.

* * * * *